(12) United States Patent
Lin et al.

(10) Patent No.: US 8,134,857 B2
(45) Date of Patent: Mar. 13, 2012

(54) METHODS FOR HIGH SPEED READING OPERATION OF PHASE CHANGE MEMORY AND DEVICE EMPLOYING SAME

(75) Inventors: Yuyu Lin, Taipei (TW); Yi-Chou Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 49 days.

(21) Appl. No.: 12/466,650

(22) Filed: May 15, 2009

(65) Prior Publication Data

US 2009/0323409 A1 Dec. 31, 2009

Related U.S. Application Data

(60) Provisional application No. 61/076,516, filed on Jun. 27, 2008.

(51) Int. Cl.
*G11C 11/00* (2006.01)
(52) U.S. Cl. ............ 365/148; 365/136; 365/189.15
(58) Field of Classification Search .......... 365/148, 365/163, 189.15
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |

(Continued)

OTHER PUBLICATIONS

"Magnetic Bit Boost," www.sciencenews.org, Dec. 18 & 25, 2004, p. 389, vol. 166.

(Continued)

*Primary Examiner* — Hoai V Ho
(74) *Attorney, Agent, or Firm* — Haynes Beffel & Wolfeld LLP

(57) ABSTRACT

Phase change based memory devices and methods for operating described herein overcome the performance limitations of slow set speeds and long recovery times commonly associated with phase change memory devices, enabling high speed operation and extending their usefulness into high speed applications typically filled by DRAM and SRAM memory.

26 Claims, 18 Drawing Sheets

U.S. PATENT DOCUMENTS

| | | | |
|---|---|---|---|
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,545,907 B1 | 4/2003 | Lowrey et al. |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,625,054 B2 | 9/2003 | Lowrey et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,085,154 B2 | 8/2006 | Cho et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |
| 7,190,607 B2 | 3/2007 | Cho et al. |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |

| | | | |
|---|---|---|---|
| 7,254,059 B2 | 8/2007 | Li et al. | |
| 7,269,052 B2 | 9/2007 | Segal et al. | |
| 7,277,317 B2 | 10/2007 | Le Phan et al. | |
| 7,291,556 B2 | 11/2007 | Choi et al. | |
| 7,309,630 B2 | 12/2007 | Fan et al. | |
| 7,321,130 B2 | 1/2008 | Lung et al. | |
| 7,323,708 B2 | 1/2008 | Lee et al. | |
| 7,323,734 B2 | 1/2008 | Ha et al. | |
| 7,332,370 B2 | 2/2008 | Chang et al. | |
| 7,335,906 B2 | 2/2008 | Toda | |
| 7,336,526 B2 | 2/2008 | Osada et al. | |
| 7,351,648 B2 | 4/2008 | Furukawa et al. | |
| 7,359,231 B2 | 4/2008 | Venkataraman et al. | |
| 7,364,935 B2 | 4/2008 | Lung et al. | |
| 7,365,385 B2 | 4/2008 | Abbott | |
| 7,379,328 B2 | 5/2008 | Osada et al. | |
| 7,385,235 B2 | 6/2008 | Lung et al. | |
| 7,388,273 B2 | 6/2008 | Burr et al. | |
| 7,394,088 B2 | 7/2008 | Lung | |
| 7,397,060 B2 | 7/2008 | Lung | |
| 7,400,522 B2 | 7/2008 | Toda et al. | |
| 7,423,300 B2 | 9/2008 | Lung et al. | |
| 7,426,134 B2 | 9/2008 | Happ et al. | |
| 7,440,308 B2 | 10/2008 | Jeong et al. | |
| 7,449,710 B2 | 11/2008 | Lung | |
| 7,473,576 B2 | 1/2009 | Lung | |
| 7,479,649 B2 | 1/2009 | Lung | |
| 7,485,891 B2 | 2/2009 | Hamann et al. | |
| 7,502,252 B2 | 3/2009 | Fuji et al. | |
| 7,505,330 B2 | 3/2009 | Pawlowski et al. | |
| 7,507,986 B2 | 3/2009 | Lung | |
| 7,514,334 B2 | 4/2009 | Chen et al. | |
| 7,514,705 B2 | 4/2009 | Breitwisch et al. | |
| 7,515,461 B2 | 4/2009 | Happ et al. | |
| 2002/0070457 A1 | 6/2002 | Sun et al. | |
| 2002/0113273 A1 | 8/2002 | Hwang et al. | |
| 2003/0072195 A1 | 4/2003 | Mikolajick | |
| 2003/0095426 A1 | 5/2003 | Hush et al. | |
| 2003/0186481 A1 | 10/2003 | Lung | |
| 2004/0026686 A1 | 2/2004 | Lung | |
| 2004/0051094 A1 | 3/2004 | Ooishi | |
| 2004/0113137 A1 | 6/2004 | Lowrey | |
| 2004/0165422 A1 | 8/2004 | Hideki et al. | |
| 2004/0248339 A1 | 12/2004 | Lung | |
| 2004/0256610 A1 | 12/2004 | Lung | |
| 2005/0018526 A1 | 1/2005 | Lee | |
| 2005/0029502 A1 | 2/2005 | Hudgens | |
| 2005/0052904 A1 | 3/2005 | Cho et al. | |
| 2005/0062087 A1 | 3/2005 | Chen et al. | |
| 2005/0093022 A1 | 5/2005 | Lung | |
| 2005/0127349 A1 | 6/2005 | Horak et al. | |
| 2005/0141261 A1 | 6/2005 | Ahn | |
| 2005/0145984 A1 | 7/2005 | Chen et al. | |
| 2005/0167656 A1 | 8/2005 | Sun et al. | |
| 2005/0191804 A1 | 9/2005 | Lai et al. | |
| 2005/0195633 A1 | 9/2005 | Choi et al. | |
| 2005/0201182 A1 | 9/2005 | Osada et al. | |
| 2005/0212024 A1 | 9/2005 | Happ | |
| 2005/0212026 A1 | 9/2005 | Chung et al. | |
| 2005/0215009 A1 | 9/2005 | Cho | |
| 2005/0263829 A1 | 12/2005 | Song et al. | |
| 2006/0006472 A1 | 1/2006 | Jiang | |
| 2006/0034112 A1 | 2/2006 | Oh et al. | |
| 2006/0038221 A1 | 2/2006 | Lee et al. | |
| 2006/0066156 A1 | 3/2006 | Dong et al. | |
| 2006/0073642 A1 | 4/2006 | Yeh et al. | |
| 2006/0091476 A1 | 5/2006 | Pinnow et al. | |
| 2006/0094154 A1 | 5/2006 | Lung | |
| 2006/0105556 A1* | 5/2006 | Matsui et al. ................. 438/584 |
| 2006/0108667 A1 | 5/2006 | Lung | |
| 2006/0110878 A1 | 5/2006 | Lung et al. | |
| 2006/0110888 A1 | 5/2006 | Cho et al. | |
| 2006/0113520 A1 | 6/2006 | Yamamoto et al. | |
| 2006/0113521 A1 | 6/2006 | Lung | |
| 2006/0118913 A1 | 6/2006 | Yi et al. | |
| 2006/0124916 A1 | 6/2006 | Lung | |
| 2006/0126395 A1 | 6/2006 | Chen et al. | |
| 2006/0131555 A1 | 6/2006 | Liu et al. | |
| 2006/0138467 A1 | 6/2006 | Lung | |
| 2006/0154185 A1 | 7/2006 | Ho et al. | |
| 2006/0157680 A1 | 7/2006 | Takaura et al. | |
| 2006/0157681 A1 | 7/2006 | Chen et al. | |
| 2006/0163554 A1 | 7/2006 | Lankhorst et al. | |
| 2006/0172067 A1 | 8/2006 | Ovshinsky et al. | |
| 2006/0175599 A1 | 8/2006 | Happ | |
| 2006/0190672 A1* | 8/2006 | Fuji ............................... 711/100 |
| 2006/0198183 A1* | 9/2006 | Kawahara et al. ............ 365/163 |
| 2006/0202245 A1 | 9/2006 | Zuliani et al. | |
| 2006/0205108 A1 | 9/2006 | Maimon et al. | |
| 2006/0211165 A1 | 9/2006 | Hwang et al. | |
| 2006/0226409 A1 | 10/2006 | Burr et al. | |
| 2006/0234138 A1 | 10/2006 | Fehlhaber et al. | |
| 2006/0237756 A1 | 10/2006 | Park et al. | |
| 2006/0245236 A1 | 11/2006 | Zaidi | |
| 2006/0250885 A1 | 11/2006 | Cho et al. | |
| 2006/0261392 A1 | 11/2006 | Lee et al. | |
| 2006/0266993 A1 | 11/2006 | Suh et al. | |
| 2006/0284157 A1 | 12/2006 | Chen et al. | |
| 2006/0284158 A1 | 12/2006 | Lung et al. | |
| 2006/0284214 A1 | 12/2006 | Chen | |
| 2006/0284279 A1 | 12/2006 | Lung et al. | |
| 2006/0286709 A1 | 12/2006 | Lung et al. | |
| 2006/0286743 A1 | 12/2006 | Lung et al. | |
| 2006/0289847 A1 | 12/2006 | Dodge | |
| 2006/0289848 A1 | 12/2006 | Dennison | |
| 2007/0007613 A1 | 1/2007 | Wang et al. | |
| 2007/0008786 A1 | 1/2007 | Scheuerlein | |
| 2007/0030721 A1 | 2/2007 | Segal et al. | |
| 2007/0037101 A1 | 2/2007 | Morioka | |
| 2007/0040159 A1 | 2/2007 | Wang | |
| 2007/0051936 A1 | 3/2007 | Pellizzer et al. | |
| 2007/0096162 A1 | 5/2007 | Happ et al. | |
| 2007/0096248 A1 | 5/2007 | Philipp et al. | |
| 2007/0108077 A1 | 5/2007 | Lung et al. | |
| 2007/0108429 A1 | 5/2007 | Lung | |
| 2007/0108430 A1 | 5/2007 | Lung | |
| 2007/0108431 A1 | 5/2007 | Chen et al. | |
| 2007/0109836 A1 | 5/2007 | Lung | |
| 2007/0109843 A1 | 5/2007 | Lung et al. | |
| 2007/0111429 A1 | 5/2007 | Lung | |
| 2007/0115794 A1 | 5/2007 | Lung | |
| 2007/0117315 A1 | 5/2007 | Lai et al. | |
| 2007/0120104 A1 | 5/2007 | Ahn et al. | |
| 2007/0121363 A1 | 5/2007 | Lung | |
| 2007/0121374 A1 | 5/2007 | Lung et al. | |
| 2007/0126040 A1 | 6/2007 | Lung | |
| 2007/0131922 A1 | 6/2007 | Lung | |
| 2007/0138458 A1 | 6/2007 | Lung | |
| 2007/0140029 A1 | 6/2007 | Kim et al. | |
| 2007/0147105 A1 | 6/2007 | Lung et al. | |
| 2007/0153563 A1 | 7/2007 | Nirschl | |
| 2007/0153570 A1 | 7/2007 | Suh | |
| 2007/0154847 A1 | 7/2007 | Chen et al. | |
| 2007/0155172 A1 | 7/2007 | Lai et al. | |
| 2007/0156949 A1 | 7/2007 | Rudelic et al. | |
| 2007/0158632 A1 | 7/2007 | Ho | |
| 2007/0158633 A1 | 7/2007 | Lai et al. | |
| 2007/0158645 A1 | 7/2007 | Lung | |
| 2007/0158690 A1 | 7/2007 | Ho et al. | |
| 2007/0158862 A1 | 7/2007 | Lung | |
| 2007/0161186 A1 | 7/2007 | Ho | |
| 2007/0170881 A1 | 7/2007 | Noh et al. | |
| 2007/0173019 A1 | 7/2007 | Ho et al. | |
| 2007/0173063 A1 | 7/2007 | Lung | |
| 2007/0176261 A1 | 8/2007 | Lung | |
| 2007/0187664 A1 | 8/2007 | Happ | |
| 2007/0201267 A1 | 8/2007 | Happ et al. | |
| 2007/0215852 A1 | 9/2007 | Lung | |
| 2007/0224726 A1 | 9/2007 | Chen et al. | |
| 2007/0235811 A1 | 10/2007 | Furukawa et al. | |
| 2007/0236989 A1 | 10/2007 | Lung | |
| 2007/0246699 A1 | 10/2007 | Lung | |
| 2007/0249090 A1 | 10/2007 | Philipp et al. | |
| 2007/0252127 A1 | 11/2007 | Arnold et al. | |
| 2007/0257300 A1 | 11/2007 | Ho et al. | |
| 2007/0262388 A1 | 11/2007 | Ho et al. | |
| 2007/0267618 A1 | 11/2007 | Zaidi et al. | |
| 2007/0267721 A1* | 11/2007 | Kuh et al. ..................... 257/616 |

| | | | |
|---|---|---|---|
| 2007/0274121 A1 | 11/2007 | Lung et al. | |
| 2007/0285960 A1 | 12/2007 | Lung et al. | |
| 2007/0285976 A1* | 12/2007 | Happ et al. | 365/163 |
| 2007/0298535 A1 | 12/2007 | Lung | |
| 2008/0006811 A1 | 1/2008 | Philipp et al. | |
| 2008/0012000 A1 | 1/2008 | Harshfield | |
| 2008/0014676 A1 | 1/2008 | Lung et al. | |
| 2008/0025089 A1 | 1/2008 | Scheuerlein et al. | |
| 2008/0043520 A1 | 2/2008 | Chen | |
| 2008/0062740 A1* | 3/2008 | Baek et al. | 365/148 |
| 2008/0089104 A1* | 4/2008 | Tanaka et al. | 365/53 |
| 2008/0094871 A1 | 4/2008 | Parkinson | |
| 2008/0101110 A1 | 5/2008 | Happ et al. | |
| 2008/0137400 A1 | 6/2008 | Chen et al. | |
| 2008/0138929 A1 | 6/2008 | Lung | |
| 2008/0138930 A1 | 6/2008 | Lung | |
| 2008/0138931 A1 | 6/2008 | Lung | |
| 2008/0164453 A1 | 7/2008 | Breitwisch et al. | |
| 2008/0165569 A1 | 7/2008 | Chen et al. | |
| 2008/0165570 A1 | 7/2008 | Happ et al. | |
| 2008/0165572 A1 | 7/2008 | Lung | |
| 2008/0166875 A1 | 7/2008 | Lung | |
| 2008/0179582 A1 | 7/2008 | Burr et al. | |
| 2008/0180990 A1 | 7/2008 | Lung | |
| 2008/0186755 A1 | 8/2008 | Lung et al. | |
| 2008/0191187 A1 | 8/2008 | Lung et al. | |
| 2008/0192534 A1 | 8/2008 | Lung | |
| 2008/0197334 A1 | 8/2008 | Lung | |
| 2008/0212363 A1* | 9/2008 | Fuji | 365/163 |
| 2008/0224119 A1 | 9/2008 | Burr et al. | |
| 2008/0225489 A1 | 9/2008 | Cai et al. | |
| 2008/0265234 A1 | 10/2008 | Breitwisch et al. | |
| 2008/0303014 A1 | 12/2008 | Goux et al. | |
| 2009/0001341 A1 | 1/2009 | Breitwisch et al. | |
| 2009/0003034 A1* | 1/2009 | Happ et al. | 365/148 |
| 2009/0014704 A1 | 1/2009 | Chen et al. | |
| 2009/0023242 A1 | 1/2009 | Lung | |
| 2009/0027950 A1 | 1/2009 | Lam et al. | |
| 2009/0042335 A1 | 2/2009 | Lung | |
| 2009/0057641 A1 | 3/2009 | Lung | |
| 2009/0098678 A1 | 4/2009 | Lung | |
| 2009/0109737 A1* | 4/2009 | Kostylev | 365/163 |
| 2009/0166603 A1 | 7/2009 | Lung | |
| 2009/0168481 A1* | 7/2009 | Stipe | 365/163 |
| 2009/0273968 A1 | 11/2009 | Lamorey et al. | |

OTHER PUBLICATIONS

"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, published in 1997, pp. 1-6.
Bedeschi, F. et al., "4-MB MOSFET-Selected Phase-Change Memory Experimental Chip," IEEE, 2004, 4 PP.
Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.
Chen, An et al., "Non-Volatile Resistive Switching for Advanced Memory Applications," IEEE IEDM, Dec. 5-7, 2005, 4 pp.
Cho, S. L. et al., "Highly Scalable On-axis Confined Cell Structure for High Density PRAM beyond 256Mb, " 2005 Symposium on VLSI Technology Digest of Technical Papers, pp. 96-97.
Gibson, G. A. et al., "Phase-change Recording Medium that Enables Ultrahigh-density Electron-beam Data Storage, " Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Gleixner, "Phase Change Memory Reliability", 22nd NVSMW, Aug. 26, 2007, 46 pages.
Ha, Y. H. et al., "An Edge Contact Type Cell for Phase Change RAM Featuring Very Low Power Consumption," 2003 Symposium on VLSI Technology Digest of Technical Papers, pp. 175-176.
Hanzawa, Satoru, et al., "A 512kB Embedded Phase Change Memory with 416kB/s Write Throughput at 100µA Cell Write Current," ISSCC 2007, Session 26, Non-Volatile Memories/26.2, 3 pages.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.
Ielmini, Daniele, et al., "Recovery and Drift Dynamics of Resistance and Threshold Voltages in Phase-Change Memories," IEEE Transactions on Electron Devices, vol. 54, No. 2, Feb. 2007, 8 pages.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Kim, Kinam et al., "Reliability Investigations for Manufacturable High Density PRAM," IEEE 43rd Annual International Reliability Physics Symposium, San Jose, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM 2004, 4 pp.
Lai, Stefan, "Current Status of the Phase Change Memory and Its Future," IEEE IEDM 2003, pp. 255-258.
Lai, Stephan et al., "OUM-A 180 nm Nonvolatile Memory Cell Element Technology for Stand Alone and Embedded Applications," IEEE IEDM 2001, pp. 803-806.
Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.
Mott, Nevill, "Electrons in Glass," Nobel Lecture, Dec. 8, 1977, Physics, 1977, pp. 403-413.
Oh, Hyung-Rok, et al., "Enhanced Write Performance of a 64Mb Phase-Change Random Access Memory," ISSCC 2005, Session 2, Non-Volatile Memory, 2.3, 3 pages.
Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase -Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Pirovano, Agostino, et al., "Low-Field Amorphous State Resistance and Threshold Voltage Drift in Chalcogenide Materials," IEEE Transactions on Electron Devices, vol. 51, No. 5, May 2004, 6 pages.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era- vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates, " Mat. Res. Soc. Symp. Proc., vol. 106, 1998, pp. 21-26.

Baek, I.G., et al., "Highly Scalable Non-volatile Resistive Memory using Simple Binary Oxide Driven by Asymmetric Unipolar Voltage Pulses," IEEE IEDM 2004, 4 pages.

Castro, D. Tio, et al., "Evidence of the Thermo-Electric Thomson Effect and Influence on the Program Conditions and Cell Optimization in Phase-Change Memory Cells," IEEE IEDM Dec. 10-12, 2007, pp. 315-315.

Chen, Y.C., et al., "A High Performance 180nm Nonvolatile Memory Cell Using Phase Change Sn-Doped $Ge_2Sb_2Te_5$ Chalcogenide," IEEE 2003, 4 pages.

Chen, Y.C., et al., "Ultra-Thin Phase-Change Bridge Memory Device Using GeSb," IEDM Tech. Dig. 2006, 777-780.

Lin, Y.Y., et al., "Fast Speed Bipolar Operation of Ge-Sb-Te Based Phase Change Bridge Devices," SSDM 2008, Session P-4 (2008) 3 pages.

* cited by examiner

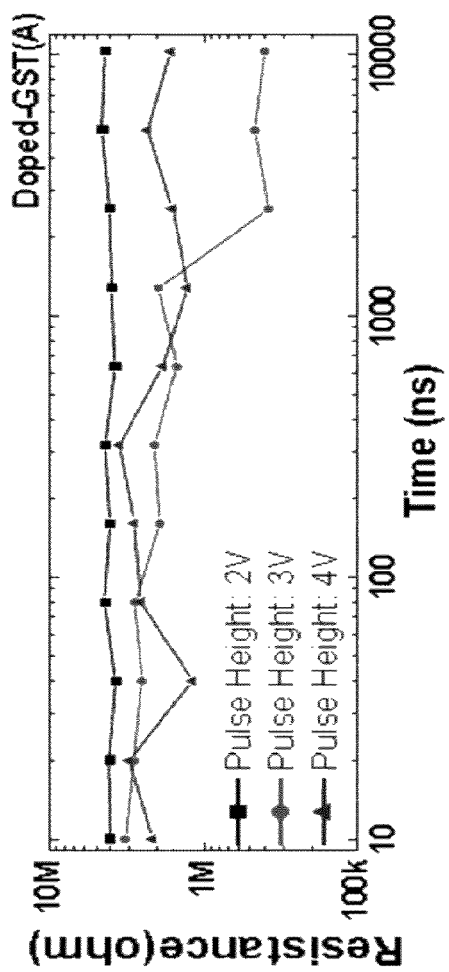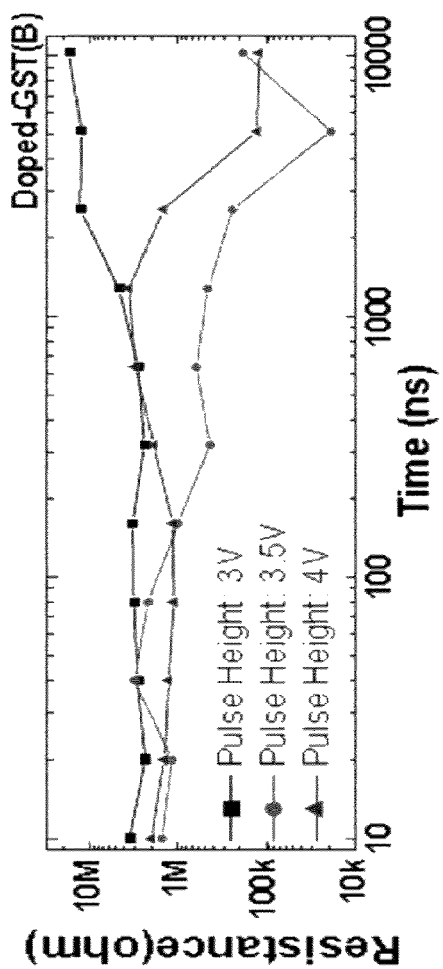
FIG. 8A
FIG. 8B

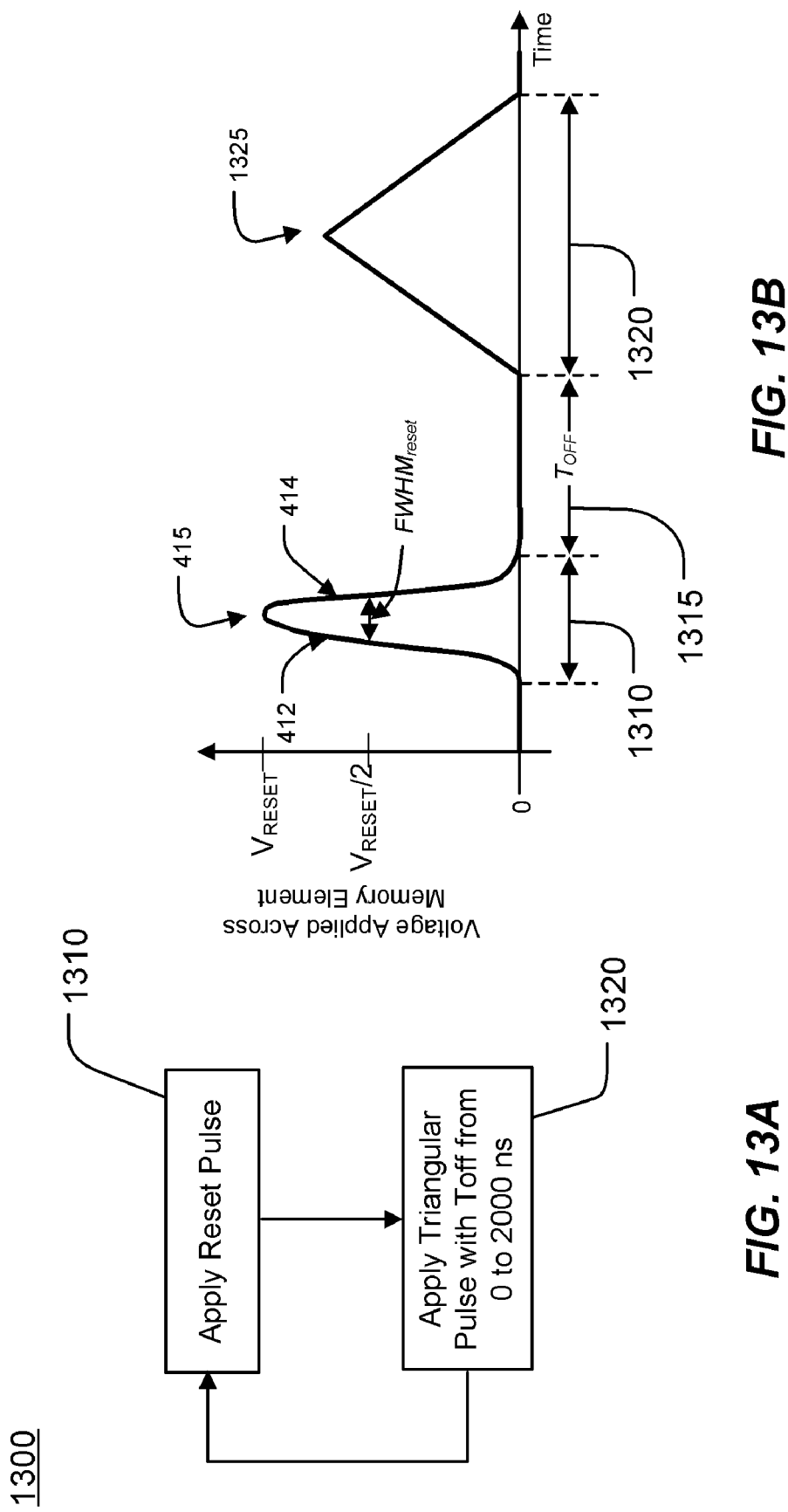

METHODS FOR HIGH SPEED READING OPERATION OF PHASE CHANGE MEMORY AND DEVICE EMPLOYING SAME

CROSS-REFERENCE TO RELATED APPLICATIONS

This application claims the benefit of U.S. Provisional Application No. 61/076,516 titled "A Method for High Speed Reading Operation of Phase Change Memory and Device Employing Same" filed Jun. 27, 2008.

This application is related to U.S. patent application Ser. No. 12/432,055 entitled "Bipolar Switching of Phase Change Device", filed on Apr. 29, 2009.

BACKGROUND OF THE INVENTION

1. Field of the Invention

The present invention relates to memory devices based on phase change based memory material, including chalcogenide based materials and other materials, and methods for operating such devices.

2. Description of Related Art

Phase change based memory materials, like chalcogenide based materials and similar materials, can be caused to change phase between an amorphous and a crystalline state by application of electrical current at levels suitable for implementation in integrated circuits. The generally amorphous state is characterized by higher electrical resistivity than the generally crystalline state, which can be readily sensed to indicate data. These properties have generated interest in using phase change material to form nonvolatile memory circuits, which can be read and written with random access.

The change from the amorphous to the crystalline, referred to as set herein, is generally a lower current operation in which current heats the phase change material above a transition temperature to cause a transition of an active region from the amorphous to the crystalline phase. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the active region to stabilize in the amorphous phase.

Two performance limitations conventionally associated with phase change memory devices are a relatively slow set operation and a relatively long recovery time.

The set operation for conventional phase change memory devices is typically significantly longer than the read and reset operations. See, for example, U.S. Pat. No. 6,545,907. This comparatively slow set operation limits the overall operational speed of the device, restricting the use of phase change based memory circuits as high speed memory.

In addition, it has been reported that the recovery (or relaxation) time required for the threshold voltage and resistance of phase change material to stabilize following a reset pulse having a pulse width of 100 ns is 30 ns or more. See, "Recovery and Drift Dynamics of Resistance and Threshold Voltages in Phase-Change Memories", by Ielmini et al., IEEE Transactions on Electron Devices, Vol. 54 No. 2, 2 Feb. 2007, pp. 308-315. These relatively long reset pulses and recovery times make phase change memory devices unavailable for use in applications which require a fast read operation following program or erase cycling.

Thus, integrated circuits employing phase change based memory circuits typically also include other types of memory circuits in order to fulfill the memory performance requirements for the various functions of the integrated circuit. These different types of memory circuits are embedded at various locations in the integrated circuit, and typically include SRAM or DRAM memory circuits in order to provide high access speed memory for the integrated circuit. However, integration of different types of memory circuits for the various memory applications in an integrated circuit can be difficult and result in highly complex designs.

It is therefore desirable to provide phase change memory devices and methods for operation which overcome the performance limitations described above and extend their usefulness into applications requiring very high speed operation.

SUMMARY OF THE INVENTION

In phase change memory, data is stored by the application of current which heats the phase change material to cause a transition of an active region between amorphous and crystalline phases.

However, immediately following the termination of the current, the phase change material experiences transient resistance behavior in which the material requires a recovery time before stabilizing to a resistance corresponding to the data value stored. Transient resistance behavior is observed for the transition from the amorphous to crystalline phase, as well as for the transition from the crystalline to the amorphous phase. Recovery time has conventionally been understood to be a constant.

As a result, the recovery time of the phase change material limits the speed at which the phase change memory can be read following a set or reset operation.

Operating methods described herein are based on the surprising discovery that, when the programming pulse width is less than or equal to about 25 ns, the recovery time of phase change material falls as a function of the programming pulse width. As a result, by applying a programming pulse width less than or equal to about 25 ns, recovery times achieved herein can be significantly smaller than those previously observed.

Thus, high speed read after program operations are demonstrated in which the sum of the pulse width of the programming and a time interval between the programming pulse and a read pulse is less than or equal to 70 ns. In some embodiments the sum is less than or equal to 50 ns, being less than or equal to 15 ns in certain embodiments. As a result, the phase change memory element can be operated at high speeds, such as those typically required of DRAM and SRAM.

A method is described herein for operating a memory cell comprising a phase change memory element programmable to a plurality of resistance states. The method comprises applying a first pulse across the phase change memory element to change the resistance state from a first resistance state to a second resistance state. The first pulse has leading and trailing edges with full-width half-maximum (FWHM) points defining a programming pulse width. The method further comprises applying a second pulse across the phase change memory element to determine the resistance state. The second pulse having leading and trailing edges with FWHM points defining a read pulse width. The FWHM point of the second pulse leading edge and the FWHM point of the first pulse trailing edge separated by a time interval. A sum of the time interval and the first pulse width is less than or equal to 70 ns, and the first pulse width is less than the time interval.

An integrated circuit device as described herein comprises a memory cell comprising a phase change memory element programmable to a plurality of resistance states. The device further includes a processor and memory storing instructions executable by the processor, including instructions for applying pulses as described above.

The first pulse may be a reset pulse for programming the memory element from a low resistance state to a high resistance state, or may be a set pulse for programming the memory element from the high resistance state to the low resistance state.

Additionally, the operations described herein comprising set and reset pulses having opposite voltage polarity are shown to result in a fast transition to the lower resistance state. Thus, the operations herein overcome the slow set speed behavior of memory cell structures such as small bridge-type memory cells which suffer significant thermo-electric effects that cause asymmetrical heating in the body of the phase change material.

As a result, phase change based memory devices and methods for operating described herein overcome the performance limitations of slow set speeds and long recovery times commonly associated with phase change memory devices, enabling high speed operation and extending their usefulness into applications typically filled by DRAM and SRAM memory.

Other aspects and advantages of the present invention can be seen on review of the drawings, the detailed description, and the claims which follow.

BRIEF DESCRIPTION OF THE DRAWINGS

FIGS. 8A-8B are the measured resistances of two bridge type memory cells as a function of the pulse width of set pulses having various pulse heights.

FIG. 13A is flow diagram of an operational sequence which can be used to determine a minimum acceptable $T_{OFF}$.

FIG. 13B is a simplified timing diagram of the operational sequence of FIG. 13A.

DETAILED DESCRIPTION

Figure 1:
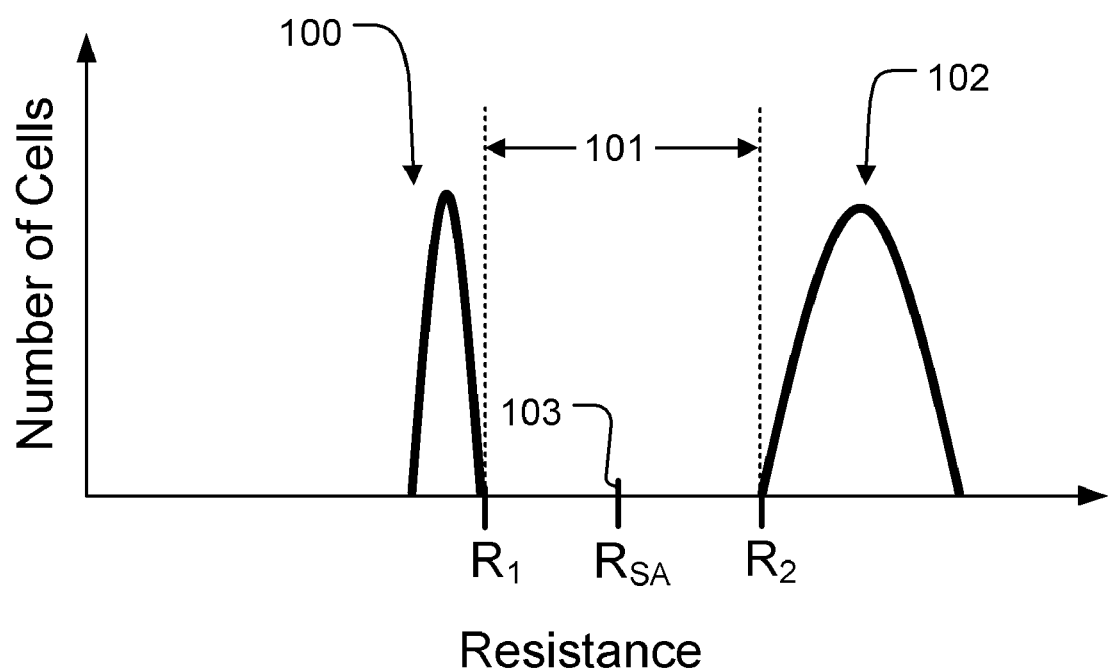
FIG. 1 is an example distribution of the resistance of a number of memory cells each comprising a phase change memory element programmable to a high resistance state and a low resistance state.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

In phase change memory, data is stored by causing transitions in an active region of the phase change material between amorphous and crystalline phases. FIG. 1 is an example distribution of the resistance for a number of memory cells each comprising a phase change memory element. The phase change memory elements of the memory cells are programmable to a plurality of resistance states including a high resistance reset (erased) state 102 and at least one lower resistance set (programmed) state 100. Each resistance state corresponds to a non-overlapping resistance range.

The change from the high resistance state 102 to the lower resistance state 100, referred to as set (or program) herein, is generally a lower current operation in which current heats the phase change material above a transition temperature to cause transition from the amorphous to the crystalline phase. The change from lower resistance state 100 to the high resistance state 102, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous phase.

The difference between the highest resistance $R_1$ of the lower resistance state 100 and the lowest resistance $R_2$ of the high resistance reset state 102 defines a read margin 101 used to distinguish cells in the lower resistance state 100 from those in the high resistance state 102. The data stored in a memory cell can be determined by determining whether the memory cell has a resistance corresponding to the lower resistance state 100 or to the high resistance state 102, for example by measuring whether the resistance of the memory cell is above or below a threshold resistance value $R_{SA}$ 103 within the read margin 101.

In order to reliably distinguish between the reset state 102 and the set state 100, it is important to maintain a relatively large read margin 101. However, following a reset operation on a phase change memory cell the resistance of the reset state 102 is not immediately observed. Instead, phase change memory cells experience transient resistance behavior in which the cell requires a recovery (or relaxation) time before increasing to a resistance within the reset state 102.

As noted above, recovery times of 30 ns or more after applying 100 ns pulse width reset pulses have been reported. These relatively long pulse widths and recovery times make phase change memory devices unavailable for use in applications such as SRAM or DRAM which require a fast read operation following program or erase cycling, typically less than 10 ns for DRAM and less than 3 ns for SRAM.

It has been discovered that the recovery time is reduced a function of programming pulse width when the pulse width is reduced to less than or equal to about 25 ns, resulting in smaller recovery times of a phase change memory element than previously reported. As a result, the resistance of the memory element stabilizes within short time intervals, for example less than 10 ns in the data shown herein. The shorter delay time for reading a device following a program or erase operation, and a larger read window between reset and set states, enable high speed operation of phase change memory devices.

Methods for operating phase change devices described herein enable very fast read following a programming procedure, extending the usefulness of phase change memory devices into fields requiring faster read following program or erase cycling.

FIGS. 2A-2D show representative prior art memory cell structures for which the high speed operations described herein can be applied.

Figure 2A:
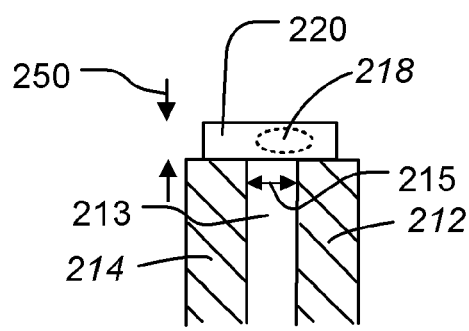
FIGS. 2A-2D show representative prior art memory cell structures for which the high speed operations described herein can be applied.

FIG. 2A is a simplified cross-sectional view of a "bridge-type" memory cell 200 illustrating a first configuration for memory element 220 coupled to first and second electrodes 212, 214. The first electrode 212 may, for example, be coupled to a terminal of an access device such as a transistor, while the second electrode 214 may be coupled to a bit line.

A dielectric spacer 213 having a width 215 separates the first and second electrodes 212, 214. The phase change material of memory element 220 has a thickness 250 and extends across the dielectric spacer 213 to contacts the first and second electrodes 212, 214, thereby defining an inter-electrode path between the first and second electrodes 212, 214 having a path length defined by the width 215 of the dielectric spacer 213. In operation, as current passes between the first and second electrodes 212, 214 and through the memory element 220, the active region 218 of the phase change material of the memory element 220 heats up more quickly than the remainder of the memory element 220.

Figure 2B:
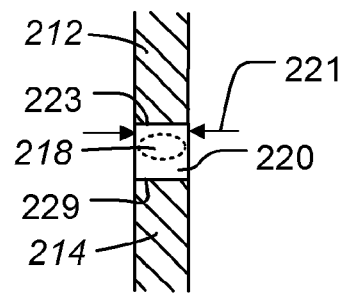

FIG. 2B is a simplified cross-sectional view of a "pillar-type" memory cell illustrating a second configuration having a pillar shaped memory element 220 surrounded by a dielectric and coupled to first and second electrodes 212, 214. The phase change material of the memory element 220 has an active region 218 and contacts the first and second electrodes 212, 214 at top and bottom surfaces 223, 229 respectively. The memory element 220 has a width (which in some embodiments is a diameter) 221 the same as that of the first and second electrodes 212, 214.

Figure 2C:
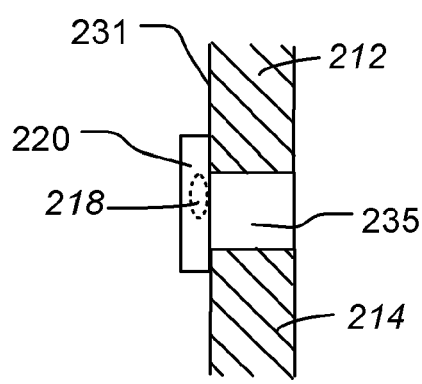

FIG. 2C is a simplified cross-sectional view of a "sidewall-type" memory cell illustrating a third configuration for memory element 220 coupled to first and second electrodes 212, 214, the phase change material of memory element 220 having an active region 218. The first and second electrodes 212, 214 are separated by dielectric spacer 235. The first and second electrodes 212, 214 and the dielectric spacer 235 have a sidewall surface 231. The phase change material of memory element 220 is on the sidewall surface 231 and extends across the dielectric spacer 235 to contact the first and second electrodes 212, 214.

Figure 2D:
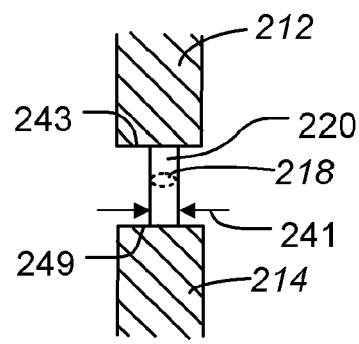

FIG. 2D is a simplified cross-sectional view of a "pore-type" memory cell illustrating a fourth configuration for memory element 220 surrounded by a dielectric and coupled to first and second electrodes 212, 214. The phase change material of memory element 220 has an active region 218 and contacts the first and second electrodes 212, 214 at top and bottom surfaces 243, 249 respectively. The memory element 220 has a width (which in some embodiments is a diameter) 241 less than that of the first and second electrodes 212, 214.

Reading or writing to the memory cell 200 can be achieved by applying appropriate bias arrangements across the memory element 220. The bias arrangements comprise applying pulses to one or both of the first and second electrodes 212, 214 to induce current through the memory element 220. The levels and durations of the pulses applied are dependent upon the operation performed (e.g. a read operation or a programming operation) and can be determined empirically for each embodiment. The bias arrangements may include pulses having a positive voltage from the second electrode 214 to the first electrode 212 (referred to herein as a positive voltage across the memory element 220), and/or may include pulses having a negative voltage from the second electrode 214 to the first electrode 212 (referred to herein as a negative voltage across the memory element 220).

In a read (or sense) operation of the memory cell 200, bias circuitry coupled to the first and second electrodes 212, 214 applies a read bias arrangement across the memory element 220 of suitable amplitude and duration to induce current to flow which does not result in the memory element 220 undergoing a change in resistive state. The current through the memory element 220 is dependent upon the resistance of the memory element 220. Thus, the current through the memory element 220 indicates the data value stored in the memory cell 200.

In a reset (or erase) operation of the memory cell 200, bias circuitry coupled to the first and second electrodes 212, 214 applies a reset bias arrangement of suitable amplitude and duration to induce a current to flow through the memory element 220, thereby raising the temperature of at least the active region above the transition (crystallization) temperature of the phase change material of the memory element 220 and also above the melting temperature to place at least the active region 218 in a liquid state. The current is then terminated, for example by terminating voltage pulses applied to the first and second electrodes 212, 214, resulting in a relatively quick quenching time as the active region 218 rapidly cools to stabilize to an amorphous phase.

In a set (or erase) operation of the memory cell 200, bias circuitry coupled to the first and second electrodes 212, 214 applies a set bias arrangement of suitable amplitude and duration to induce a current to flow through the memory element 220, thereby raising the temperature of at least a portion of the active region 218 above the transition temperature and cause a transition of at least a portion of the active region 218 from the amorphous phase to the crystalline phase, this transition lowering the resistance of the memory element 220 and setting the memory cell 200 to the desired state.

As the size of the phase change memory element 220 is reduced it can become more and more difficult to cause the active region 218 to transition from the amorphous phase of the high resistance state to the crystalline phase of the lower resistance state. As discussed below with reference to FIG. 3, it is theorized that the "difficult to set" behavior could be due to significant thermo-electric effects such as the Thomson effect which result in asymmetric heating of the phase change material.

Figure 3:
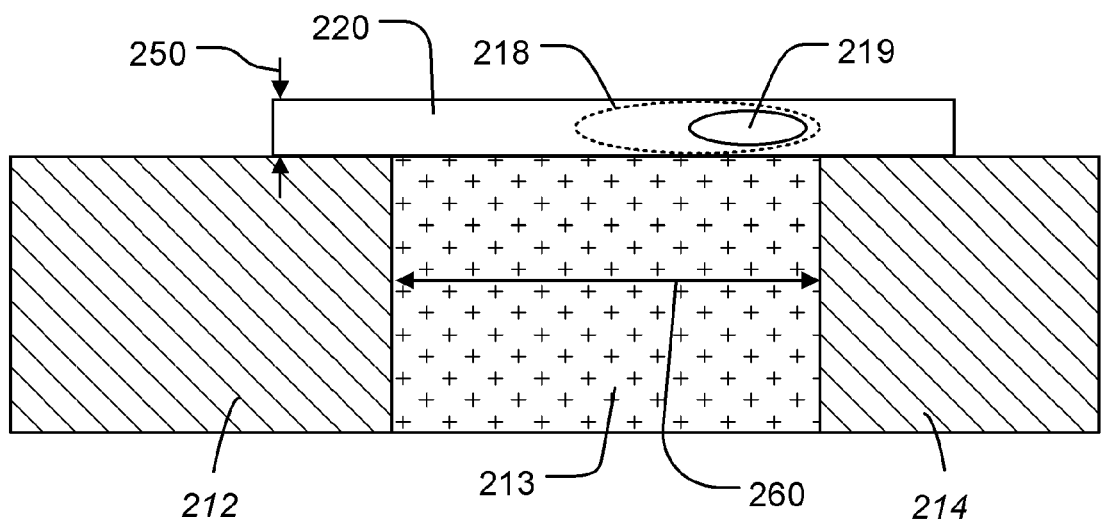
FIG. 3 is cross-sectional view of a bridge type memory cell having asymmetric heating along the current path through the memory element.

Illustrated in FIG. 3 is a bridge type memory cell 300 having first and second electrodes 212, 214 and a phase change memory element 220 extending across a dielectric spacer 213 to contact the electrodes 212, 214. The phase change memory element 220 defines an inter-electrode path between the first and second electrodes having an inter-electrode path length defined by the width 260 of the dielectric spacer 213. In operation, asymmetric heating along the current path between the electrodes 212, 214 results in an amorphous active region 218 in the higher resistance reset state that is closer to one electrode 214 than the other electrode 212.

During a set operation, heating takes place within the amorphous active region 218 since the resistance in the amorphous phase is higher than that in the crystalline phase. Due to the asymmetric heating, applying a set pulse of the same voltage polarity as a reset pulse results in an asymmetric heating zone 219 where heating takes place within the amorphous active region 218. As shown in FIG. 3, the heating zone 219 is closer to the second electrode 214.

The relatively high thermal conductivity of the electrode 214 acts to draw heat away from the heating zone 219 of the active region 218, resulting in a significant amount of heat loss during a set operation. In some instances when using set and reset pulses of the same polarity, the resistance of the memory element 220 is "difficult to set" and is reduced only when the pulse width of the set pulse is on the order to 1000 ns or more. Such a long pulse width would make the phase change memory cell 200 unavailable for use in applications which require a fast read operation following programming cycling. Additionally, the long pulse width is not desirable because it can exert large electrical and mechanical stresses on the memory cell which can ultimately damage and cause failure to the device.

The asymmetric heating zone 219 and high heat loss can also result in insufficient heating to cause a transition of the active region 218 into the low resistance crystalline phase, such that the memory cell cannot be set to the lower resistance state using single polarity operation.

Figure 4:
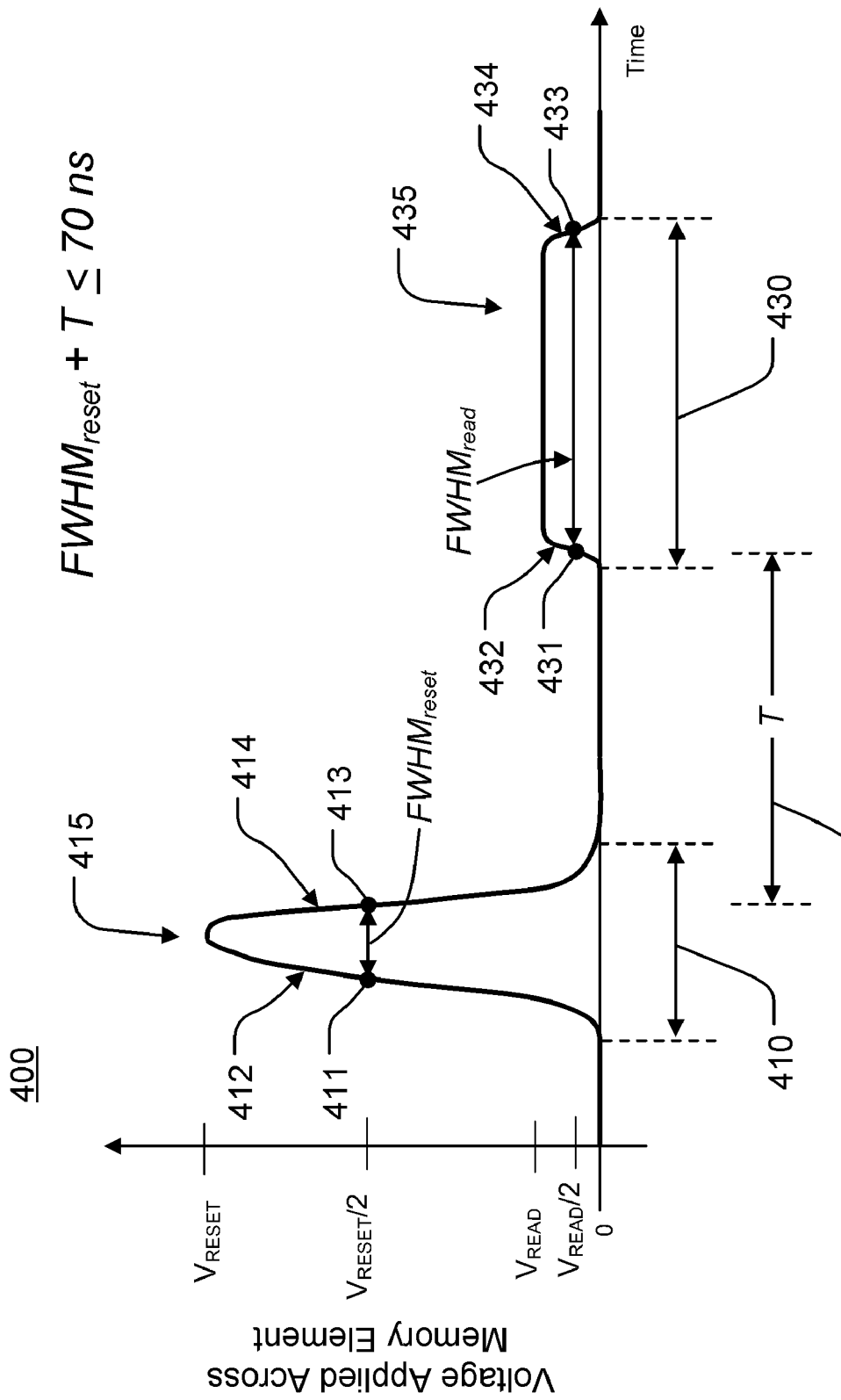
FIGS. 4 and 5 illustrate an embodiment of timing diagrams for a high speed read after reset operation and a high speed read after set operation respectively.
Figure 5:
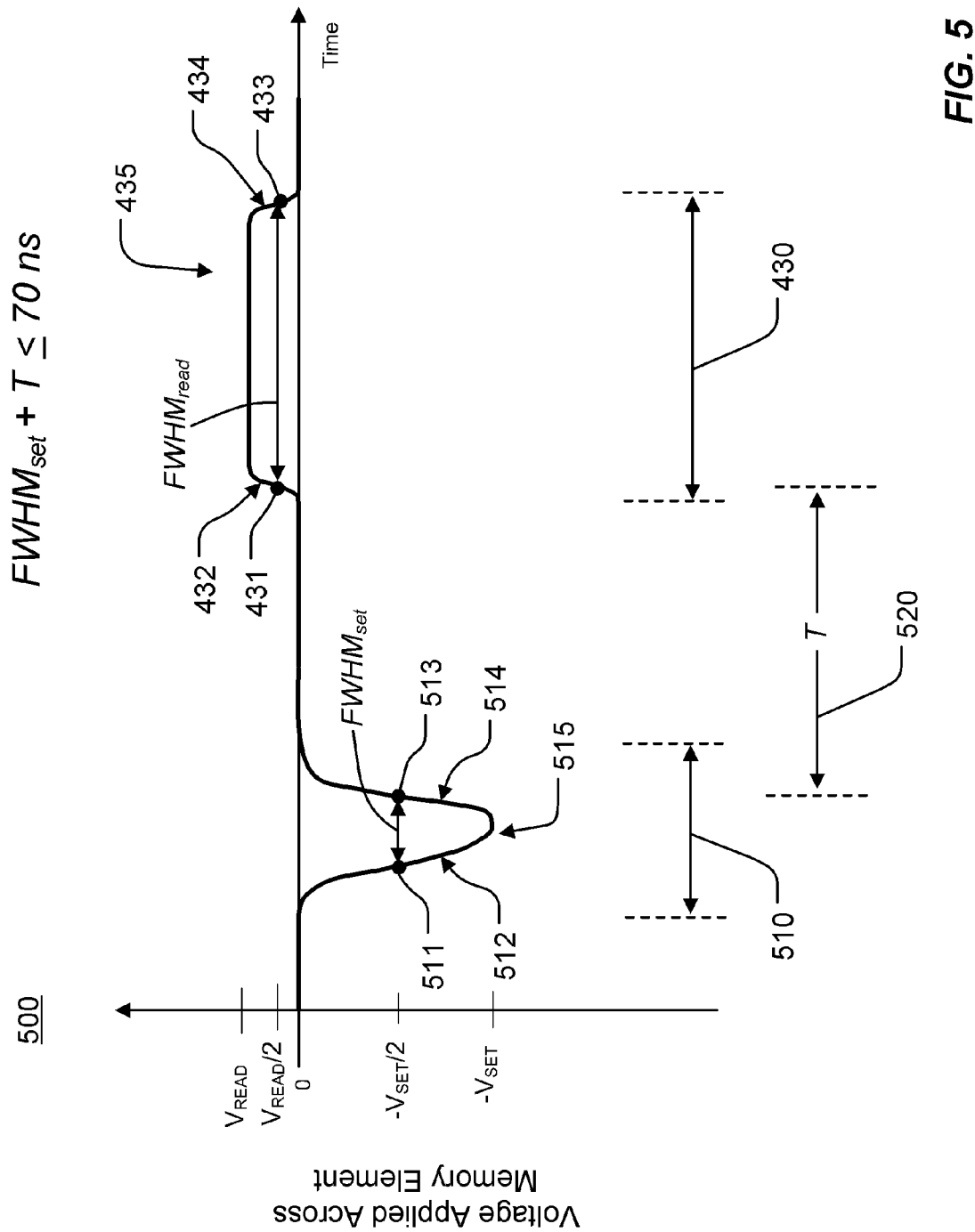

FIGS. 4 and 5 illustrate an embodiment of timing diagrams for a high speed read after reset operation 400 and a high speed read after set operation 500 respectively of the memory cell 200, the high speed operations 400, 500 also overcoming the "difficult to set" characteristic. As will be understood, the timing diagrams of FIGS. 4 and 5 are simplified and not necessarily to scale.

The operation 400 of FIG. 4 includes a reset operation 410 for programming the memory element 220 from the lower resistance state 100 to the higher resistance state 102, a read operation 430, and a time interval 420 between the programming pulse 415 and the set pulse 435.

The reset operation 400 comprises a reset pulse 415 having a first voltage polarity across the memory element 220 applied to the memory cell 200. The reset pulse 415 can be applied by changing the voltage applied to one electrode or changing the voltage applied to both of the first and second electrodes 212, 214. The reset pulse 415 has a pulse height $V_{RESET}$ and leading and trailing edges 412, 414. The leading edge 412 has a full-width at half-maximum (FWHM) point 411 where the leading edge 412 has a voltage of $V_{RESET}/2$. The trailing edge 414 has a FWHM point 413 where the trailing edge 414 has a voltage of $V_{RESET}/2$. The FWHM points 411, 413 define a full-width at half-maximum pulse width $FWHM_{RESET}$. As used herein, the term "pulse width" refers to full-width at half-maximum pulse width.

The reset pulse 415 induces current to flow from the second electrode 214 to the first electrode 212. The current is sufficient to raise the temperature of at least the active region 218 above the transition temperature and also above the melting temperature to place at least the active region 218 in a liquid state. The current is then terminated by the falling edge 414 of the reset pulse 415, allowing the active region 218 to rapidly cool and stabilize to an amorphous phase.

Following the reset pulse 415 of the reset operation 410, the resistance of the reset state 102 is not immediately observed. Instead, the phase change memory element 220 experiences transient resistance behavior in which the memory element 220 requires a recovery time before increasing to a resistance corresponding to the reset state 102. As discussed below, it is theorized that the transient resistance behavior may be related to transient free charge carriers that are activated within the phase change material by the reset pulse 315, and which settle down with time.

As will be discussed in more detail below with reference to FIGS. 9A-14, it has been discovered that a shorter reset pulse width $FWHM_{RESET}$ less than or equal to about 25 ns decreases the recovery time of the phase change memory element and thus raises the resistance of the memory element 220 within a shorter time interval, allowing for the high speed read after reset operation 300 of the memory cell 200. By having a small settling time before the resistance in the reset state stabilizes, the phase change memory element 220 can be operated at high access speeds such as those typically required of DRAM and SRAM.

The read operation 430 comprises a read pulse 435 having a pulse height $V_{READ}$ and leading and trailing edges 432, 434. The leading edge 432 has a full-width at half-maximum (FWHM) point 431 where the leading edge 432 has a voltage magnitude of $V_{READ}/2$. The trailing edge 434 has a FWHM point where the trailing edge 434 has a voltage magnitude of $V_{READ}/2$. The FWHM points 431, 433 define a full-width at half-maximum pulse width $FWHM_{READ}$.

The time interval 420 between FWHM point 413 and FWHM point 431 is sufficient for the resistance of the phase change memory element 220 to reach a resistance corresponding to the reset state 102, so that resistance state of the memory element 220 can be properly determined by the read operation 430.

The read pulse 435 induces current to flow from the second electrode 214 to the first electrode 212. The current is insufficient to cause a change in the resistance state of the memory element 220, and is dependent upon the resistance of the memory element 220. Thus, the current through the memory element 220 indicates the data value stored in the memory cell 200.

The high speed read after reset operation 400 of the timing diagram of FIG. 4 is according to the following summation of $FWHM_{RESET}$, $FWHM_{READ}$, and time interval T of equation 1:

$$FWHM_{RESET} + T \leq 70 \text{ ns} \qquad \text{Equation (1)}$$

In some embodiments the sum of equation (1) is less than or equal to 30 ns, for example being less than or equal to 15 ns. As a result, phase change memory elements can be operated at high access speeds such as those typically required of DRAM and SRAM.

The pulse widths, pulse heights, rise and fall times of the reset and set operations 410, 430, and the time interval 420, can be determined empirically for each embodiment. In some embodiments the pulse width $FWHM_{READ}$ of the read operation 435 can be between about 10 ns and 30 ns, for example being about 20 ns.

Referring to FIG. 5, the operation 500 includes a set operation 510 for programming the memory element 220 from the higher resistance state 102 to the lower resistance state 100, followed after a time interval $T_{OFF}$ 520 with a read operation 430.

The set operation 510 comprises a set pulse 515 having a voltage polarity across the memory element 220 opposite that of the reset pulse 415 of the reset operation 410.

The set pulse 515 has a pulse height $V_{SET}$ and leading and trailing edges 512, 514. The leading edge 512 has a full-width at half-maximum (FWHM) point 511 where the leading edge 512 has a voltage of $V_{SET}/2$. The trailing edge 514 has a FWHM point 513 where the trailing edge 514 has a voltage of $V_{SET}/2$. The FWHM points 511, 513 define a full-width at half-maximum pulse width $FWHM_{SET}$.

The set pulse 515 induces current to flow from the first electrode 212 to the second electrode 214. Thus, the set operation 510 induces current to flow through the memory element 220 in a direction opposite that of the reset operation 415. Since current flows in both directions through the memory element 220 during operation, the set and reset operations 510, 410 can compensate for the asymmetrical heating caused by thermo-electric effects such as the Thomson effect and allow for fast set operation. This is explained in more detail below with reference to FIG. 6.

The current induced by the set pulse 515 is sufficient to raise the temperature of the active region 218 above the transition temperature (crystallization) temperature to cause a transition of the active region 218 into a crystalline phase.

As will be shown in the measured results presented herein, the set operation 510 results in efficient heating of the active region 218 sufficient to cause a fast transition into the crystalline phase to establish the lower resistance state 100. As a result, the $FWHM_{SET}$ of the set pulse 515 can be comparable to the $FWHM_{RESET}$ of the reset operation 410, and in some embodiments is the same.

The time interval 520 between FWHM point 513 and FWHM point 531 is sufficient for the resistance of the phase change memory element 220 to reach a resistance corresponding to the reset state 102, so that resistance state of the memory element 220 can be properly determined by the read operation 430. Since the resistance following the set operation 510 is already low, the recovery time effects on the initial resistance are typically less of a concern. As a result the time interval T 520 may be less than the T 420 required following the reset operation 410.

Thus, the high speed read after set operation 500 of the timing diagram of FIG. 5 is according to the following summation of $FWHM_{SET}$ and T of equation 2:

$$FWHM_{SET} + T \leq 70 \text{ ns} \quad \text{Equation (2)}$$

In some embodiments the sum of equation (2) is less than or equal to 30 ns, for example being less than or equal to 15 ns. As a result, the set and reset operations 510, 410 described herein allow phase change memory elements to be operated at high access speeds such as those typically required of DRAM and SRAM.

The pulse widths, pulse heights, rise and fall times of the set operation 510, and the time interval 520, can be determined empirically for each embodiment.

In FIGS. 4 and 5 the read pulse 435 has a positive voltage polarity from the second electrode 214 to the first electrode 212. Alternatively, the read pulse 435 can have a negative voltage polarity.

In the illustrated embodiment of FIGS. 4 and 5, the reset pulse 415 has a positive voltage polarity from the second electrode 214 to the first electrode 212, and the set pulse 515 has a negative voltage polarity from the second electrode 214 to the first electrode 212. In an alternative embodiment, the reset pulse 415 has a negative voltage polarity from the second electrode 214 to the first electrode 212 and the set pulse 515 has a positive voltage polarity from the second electrode 214 to the first electrode 212.

Figure 6:
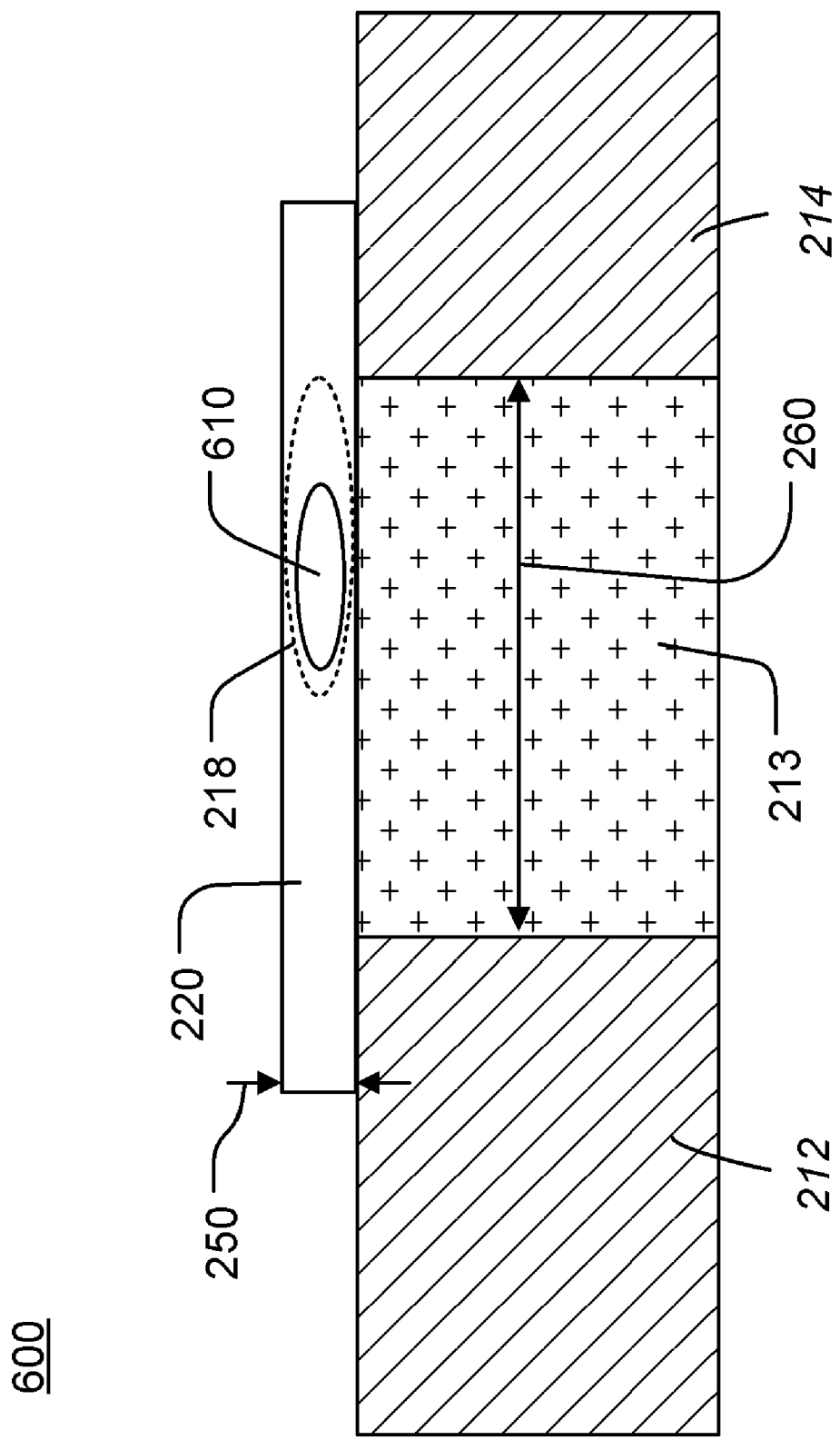
FIG. 6 is a cross-sectional view of a bridge-type memory cell including a heating zone which is closer to the middle of the device than that of the device of FIG. 3.

Illustrated in FIG. 6 is a bridge type memory cell 600 like that of FIG. 3. The reset operation 410 induces a reset current from the second electrode 214 to the first electrode 212. As is shown in FIG. 6, the asymmetric heating caused by thermo-electric effects such as the Thompson Effect during reset results in the active region 218 being closer to the second electrode 214 than the first electrode 212.

The set operation 510 induces a set current from the first electrode 212 to the second electrode 214. Due to the asymmetric heating, the heating zone 610 where heating takes place during the set operation 510 is within a portion of the active region 218 which is closer to the first electrode 212 than the second electrode 214. Thus the heating zone 610 is closer to the middle of the device than the heating zone 219 of FIG. 3. This results in fast heating sufficient to cause a transition of the active region 218 into the crystalline phase, thereby establishing the lower resistance state.

Figure 7:
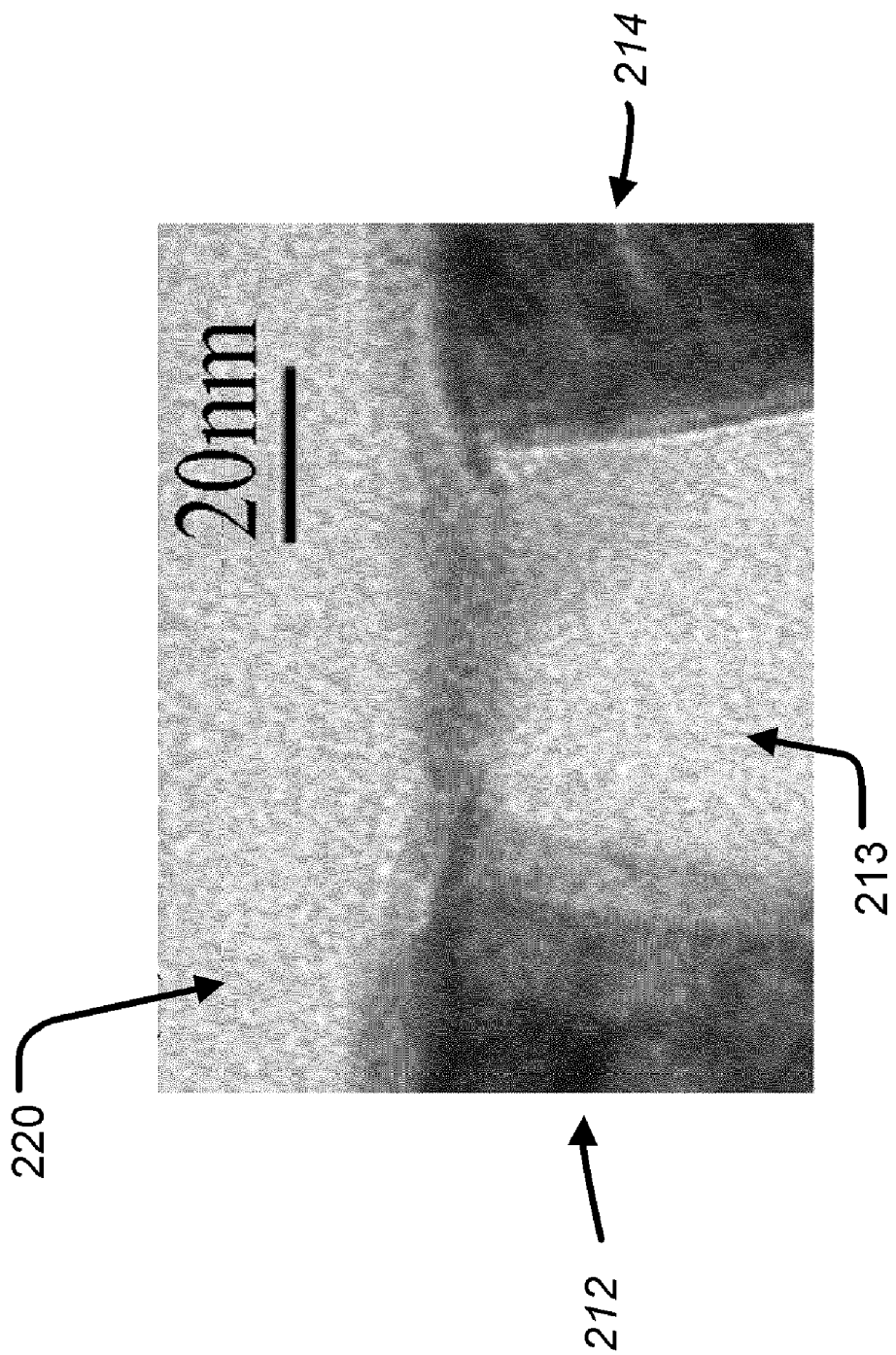
FIG. 7 is a TEM image of a cross-section of bridge-type memory cell.

FIG. 7 is a TEM image of cross-section of a bridge-type memory cell including memory element 220, first and second electrodes 212 and 214, and dielectric spacer 213. In the measured results presented herein, bridge type memory cells having widths from about 20 nm to 50 nm, a thickness of 5 nm, and lengths of about 60 to 80 nm were built and tested.

FIGS. 8A-8B are the measured resistances of two bridge type memory cells as a function of the pulse width of set pulses having various pulse heights ranging from 2 to 4 Volts, showing the difficulty in setting the memory cells to the lower resistance state using set and reset operations of the same voltage polarity.

In the data of FIG. 8A, a bridge type memory cell was measured comprising $Ge_2Sb_2Te_5$ doped with about 10 at % $SiO_2$ having a width of 20 nm, a thickness of 5 nm, and a length of 60 nm. In the data of FIG. 8B, a bridge type memory cell was measured comprising $Ge_2Sb_2Te_5$ doped with about 2 at % Ti, about 17 at % N, and about 14 at % Fe, and has a width of 20 nm, a thickness of 5 nm, and a length of 60 nm.

As can be seen in the data of FIGS. 8A-8B, when using set and reset pulses of the same polarity the memory element is "difficult to set" and the resistance of the memory element is reduced only when the pulse width of the set pulse is greater than 1000 ns for pulse heights of up to 4 Volts. Such a long pulse width would make the phase change memory cell unavailable for use in applications which require fast access speeds such as a fast read operation following program cycling. Additionally, the long pulse width is not desirable because it can exert large electrical and mechanical stresses on the memory cell which can ultimately damage and cause failure to the device.

Figure 9A:
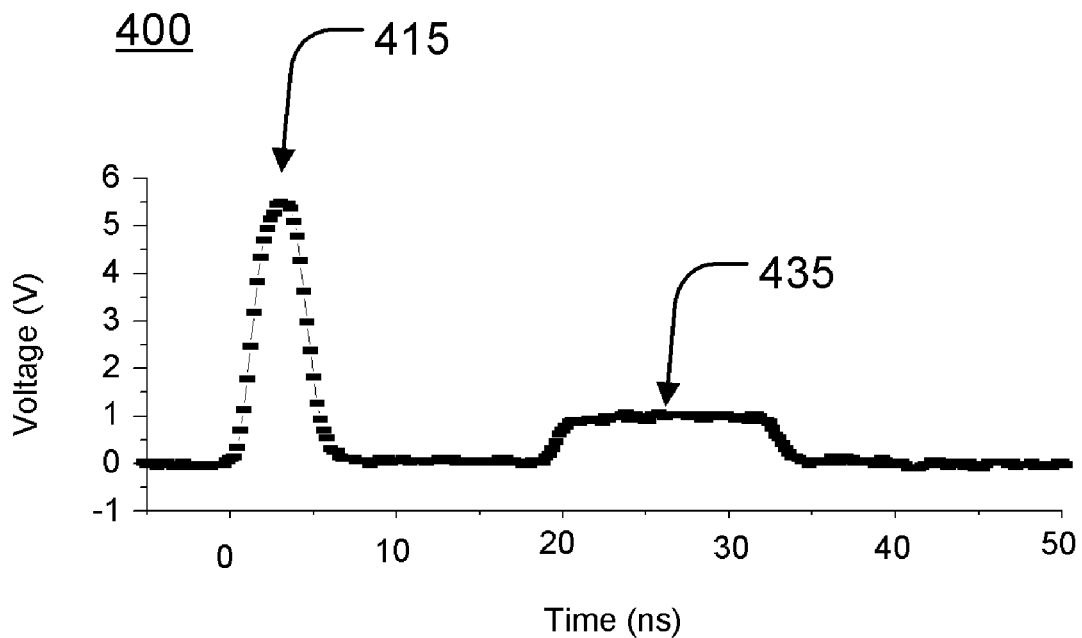
FIGS. 9A and 9B are the measured voltages of the timing diagrams of the high speed read after reset operation and the high speed read after set operations respectively.
Figure 9B:
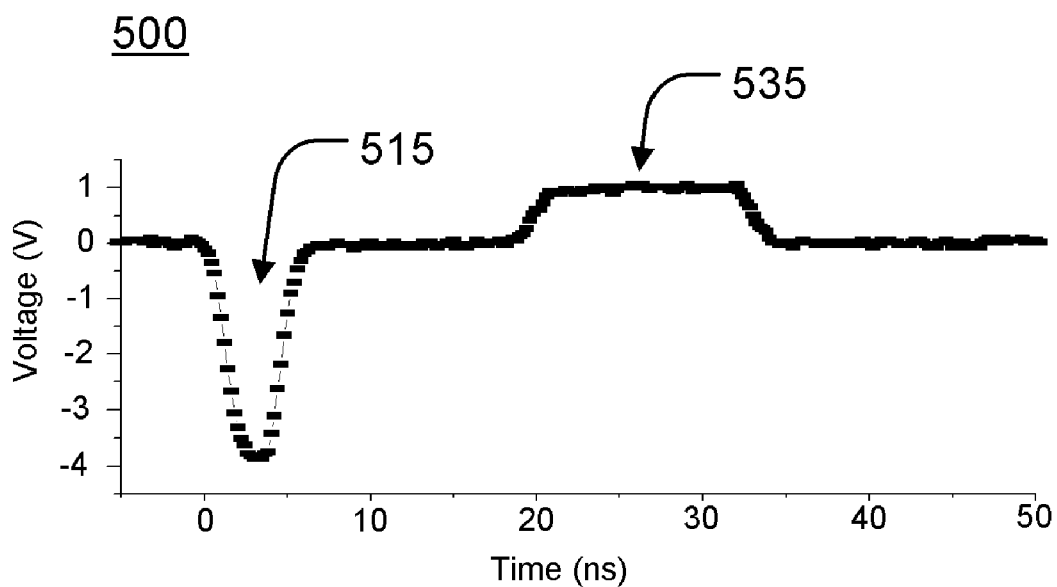

FIGS. 9A and 9B are the measured voltages of the timing diagrams of the high speed read after reset operation 400 and the high speed read after set operation 500 respectively which overcome the "difficult to set" behavior of the memory cells which were measured to obtain the data of FIGS. 8A and 8B.

Figure 10:
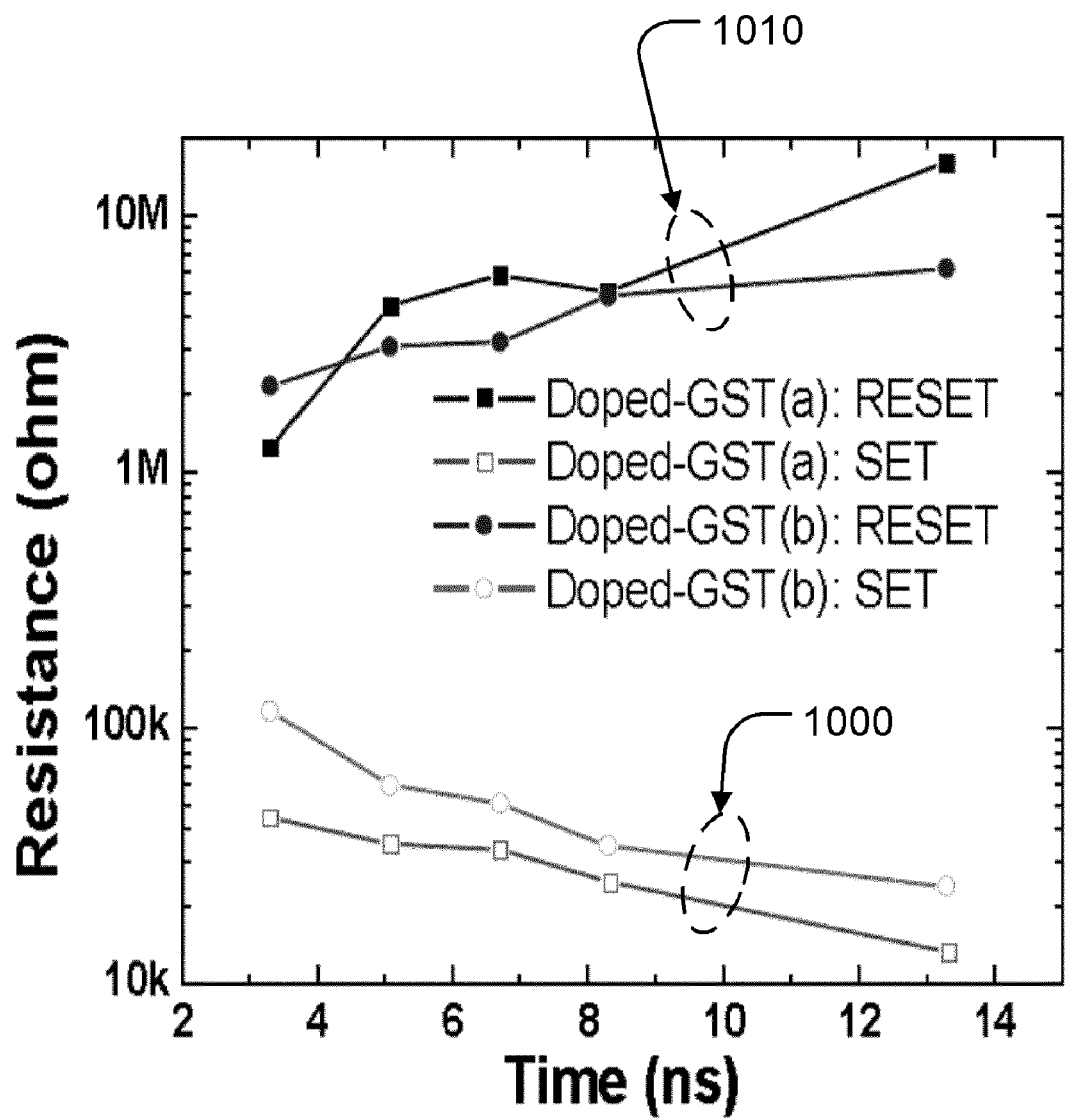
FIG. 10 is the measured resistance of the memory cells as a function of pulse width using the reset pulse of FIG. 9A and the set pulse of FIG. 9B.
Figure 11:
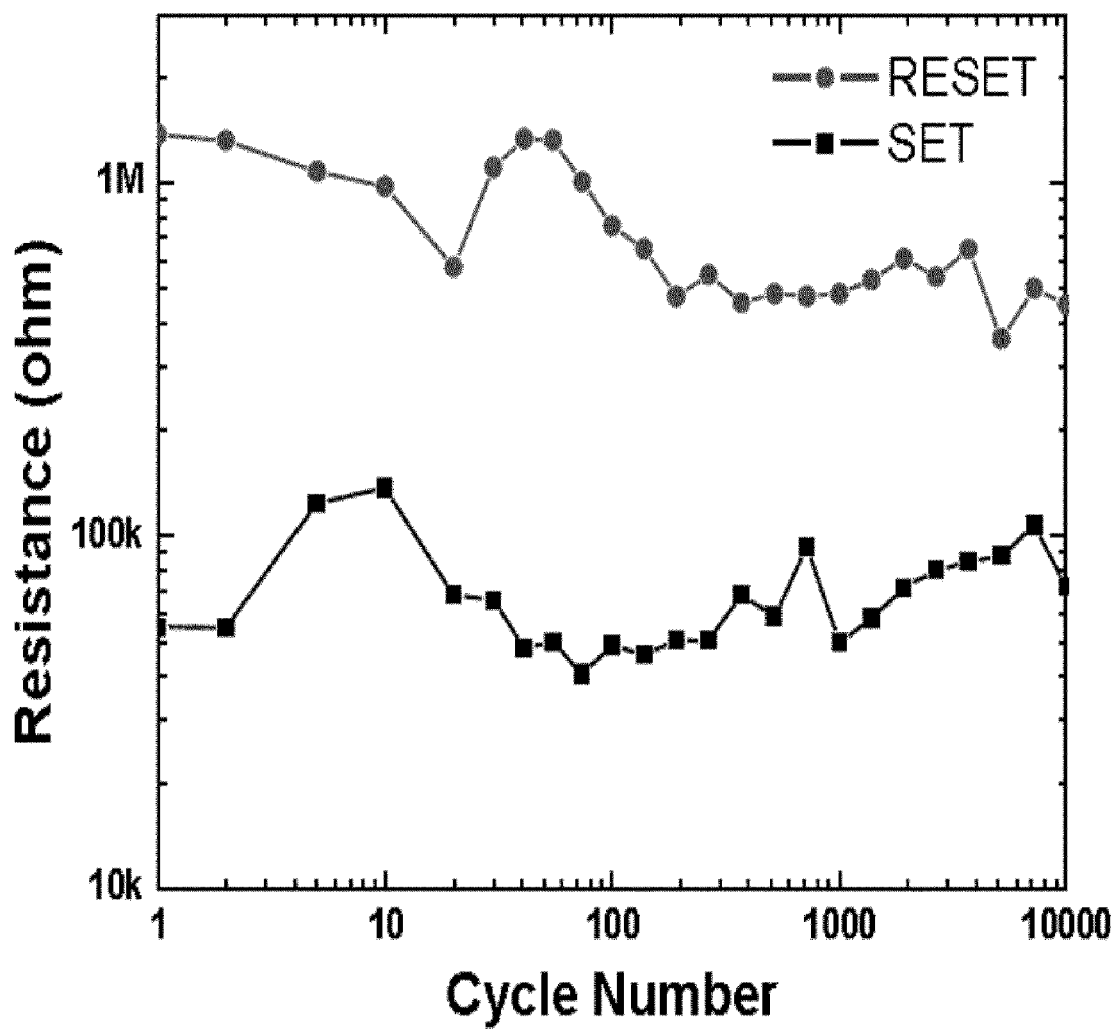
FIG. 11 is the measured cycle endurance test of a bridge type memory cell.

FIG. 10 is the measured resistance of the memory cells as a function of pulse width (FWHM) using the reset pulse 415 of FIG. 9A to change to the lower resistance state 1000, and using the set pulse 515 to change to the higher resistance state 1010. As can be seen in FIG. 10, pulse widths as small as 3.4 ns for both the reset pulse 415 and the set pulse 315 successfully program the devices, and the "difficult to set" behavior is overcome. In the data of FIG. 11 the resistance was read about 3 seconds following the reset and set pulses.

FIG. 11 is the measured cycle endurance test of a bridge type memory cell comprising $Ge_2Sb_2Te_5$ doped with about 2 at % Ti, about 17 at % N, and about 14 at % Fe, having a width of 20 nm, a thickness of 5 nm, and a length of 80 nm. The reset pulse 415 used to obtain the data of FIG. 11 has a pulse height of 7.5 V, a rise time of 1.7 ns, a fall time of 1.8 ns, and a $FWHM_{RESET}$ pulse width of 3.4 ns. The set pulse 515 used to obtain the data of FIG. 11 has a pulse height of −5.5 V, a rise time of 1.7 ns, a fall time of 1.8 ns, and a $FWHM_{SET}$ pulse width of 3.4 ns. In the data of FIG. 11 the resistance was read about 3 seconds after the reset and set pulses. As can be seen in FIG. 11, more than 10 k cycles were obtained using pulse widths of 3.4 ns.

Figure 12:
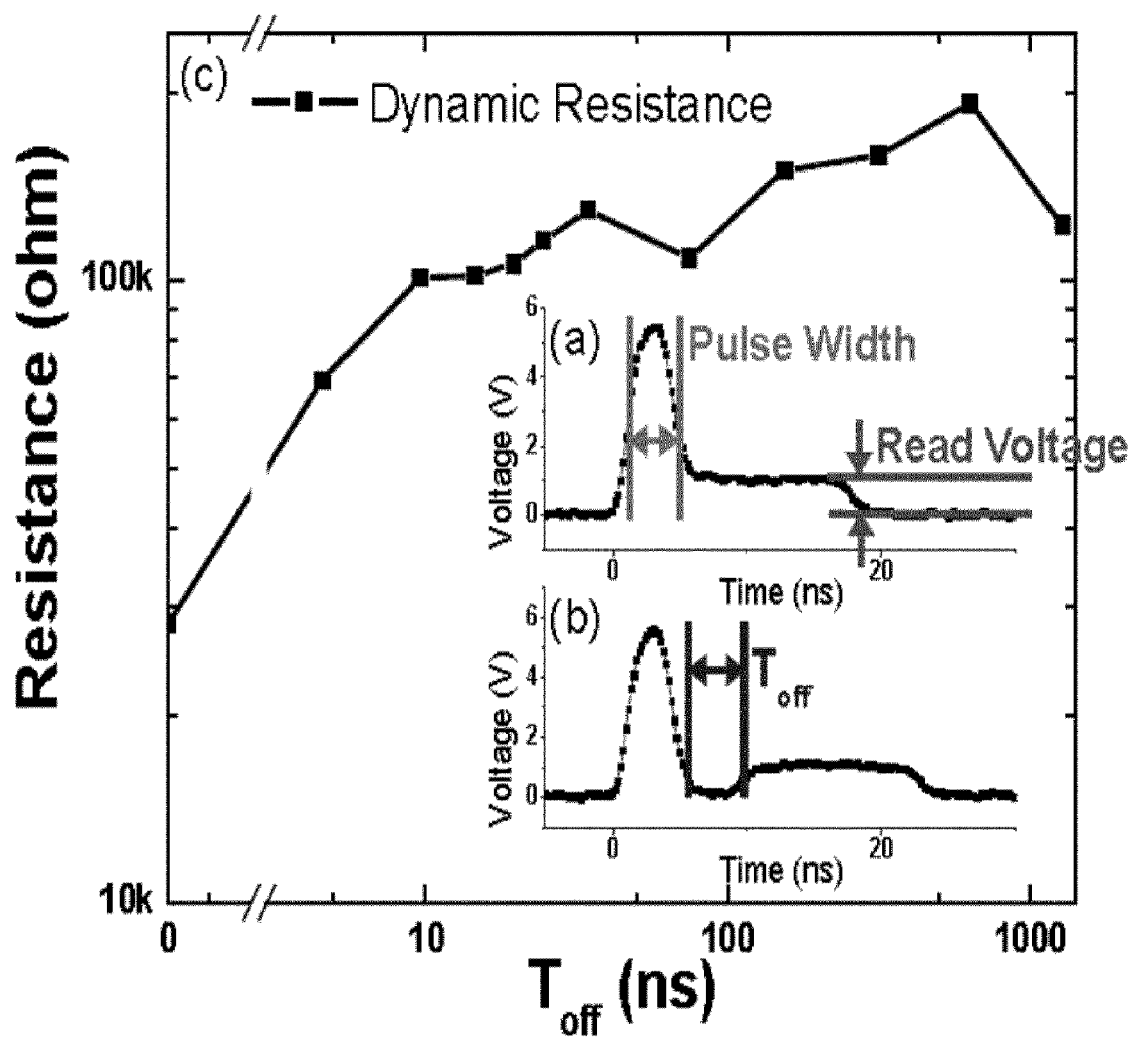
FIG. 12 is the measured resistance following the reset operation as a function of $T_{OFF}$.

FIG. 12 is the measured resistance following the reset operation 415 as a function of $T_{OFF}$ 420 of a bridge type memory cell comprising $Ge_2Sb_2Te_5$ doped with about 2 at % Ti, about 17 at % N, and about 14 at % Fe, having a width of 20 nm, a thickness of 5 nm, and a length of 60 nm. The pulse height $V_{READ}$ used to obtain the data of FIG. 12 is 1 Volt and the pulse width $FWHM_{READ}$ was 23.3 ns. The reset pulse 415 used to obtain the data of FIG. 12 has a pulse height of 5.5 V, a rise time of 1.7 ns, a fall time of 1.8 ns, and a $FWHM_{RESET}$ pulse width of 3.4 ns. As can be seen in FIG. 12, the memory element exhibits transient resistance behavior before increasing to a resistance corresponding to the reset state.

It is theorized that the transient resistance behavior may be related to transient free charge carriers that are activated within the phase change material by the reset pulse 415, and which settle down with time. It is theorized that the reset pulse 415 temporarily increases the concentration of free charge carriers within the phase change material, and the increased free charge carrier effectively reduces the resistance of the phase change material. As the time $T_{OFF}$ increases, the number of activated free charge carriers within the phase change material decreases and the resistance of the material increases. The minimum acceptable $T_{OFF}$ will depend upon the programming pulse width and thus vary from embodiment to embodiment, and can be determined empirically.

FIG. 13A is a flow diagram of an operational sequence 1300 which can be used to determine a minimum acceptable time interval 420, 520 for the timing diagrams of FIGS. 4 and 5.

As represented by the simplified timing diagram of FIG. 13B, the sequence begins at block 1310 by applying a reset pulse 415 having a pulse height $V_{RESET}$ and a pulse width $FWHM_{RESET}$.

Next, a block 1320 a triangular pulse 1325 is applied after time sequence $T_{OFF}$1315, with $T_{OFF}$ initially beginning at 0 ns and increased for each successive operation of blocks 1310 and 1320.

The reset pulse 415 of block 1310 induces a current through the memory element 220 sufficient to cause a transition from the set state 100 to the reset state 102, and the triangular pulse 1325 induces a current through the memory element 220 sufficient to cause a transition from the reset state 102 to the set state 100.

FIGS. 13C-13F are measured voltages of the operational sequence 1300 applied to a bridge type memory cell comprising $Ge_2Sb_2Te_5$ doped with about with about 2 at % Ti, about 17 at % N, and about 14 at % Fe, having a width of 20 nm, a thickness of 5 nm, and a length of 60 nm.

The time between the leading edge 412 of the reset pulse 415 and the beginning of the triangular pulse 1325 is constant at about 30 ns in the FIGS. 13C-13F. The reset pulse 415 of FIG. 13C has a $FWHM_{RESET}$ of about 3.4 ns. The reset pulse 415 of FIG. 13D has a $FWHM_{RESET}$ of about 6.7 ns. The reset pulse 415 of FIG. 13E has a $FWHM_{RESET}$ of about 13.3 ns. The reset pulse 415 of FIG. 13F has a $FWHM_{RESET}$ of about 23.3 ns.

Figure 13C:
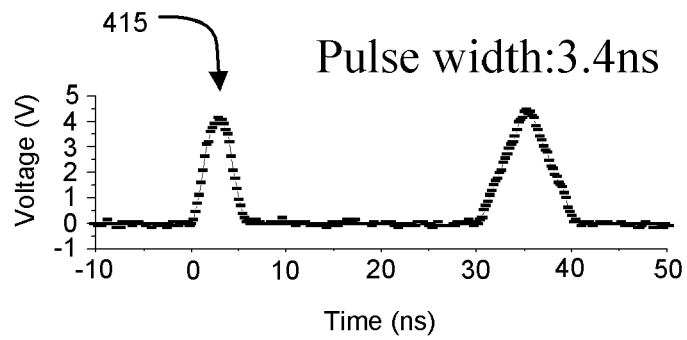
FIGS. 13C-13F are measured voltages of the operational sequence applied to a bridge type memory cell.
Figure 13D:
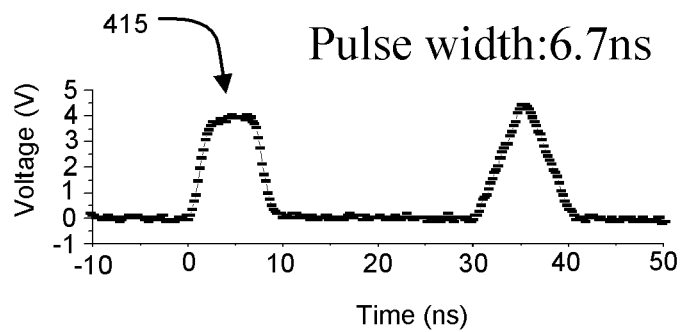
Figure 13E:
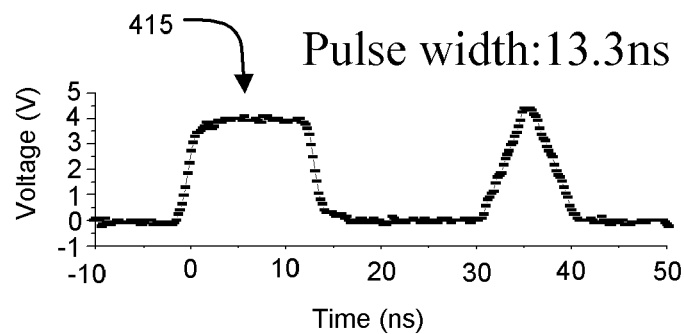
Figure 13F:
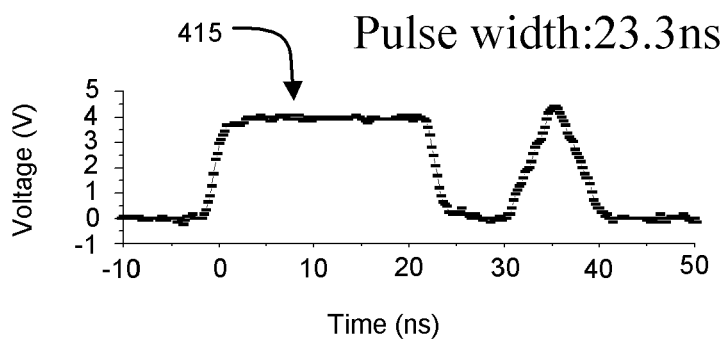
Figure 13G:
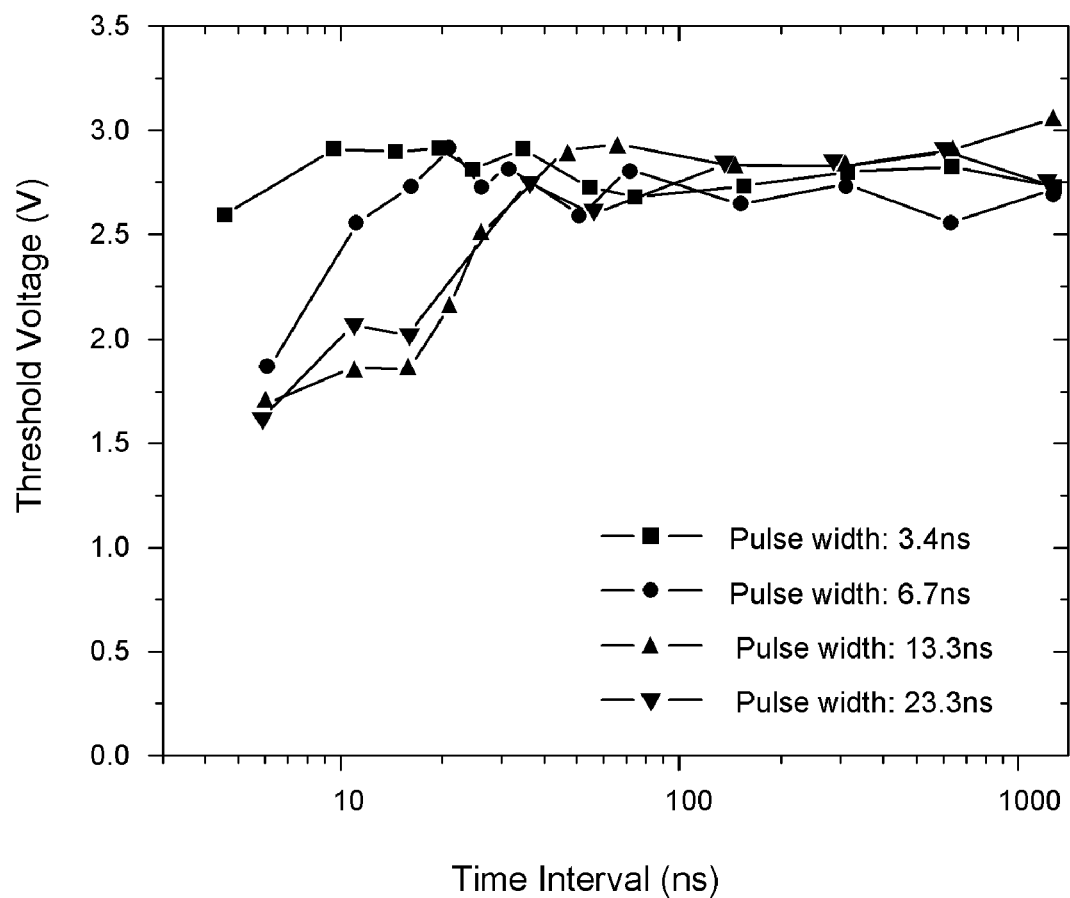
FIG. 13G is a plot of the time interval $T_{OFF}$ versus the measured threshold voltage.

The time interval $T_{off}$ 1315 and the $FWHM_{RESET}$ were varied in the operational flow diagram 1300 of FIG. 13A to provide the data of FIG. 13G. In the measured data the triangular pulse has a 5 ns rise time and a 5 ns fall time, with the 10% to 90% rise and fall times being 3.7 ns and 3.8 ns respectively. FIG. 13G is a plot of the time interval $T_{OFF}$ 1315 versus threshold voltage $V_{TH}$. The threshold voltage $V_{TH}$ Of the memory element 220 as used herein is the voltage level of the triangular pulse 1325 at which a predetermined current is reached sufficient to cause a transition from the reset state 102 to the set state 100. The predetermined current will vary from embodiment to embodiment, and can be determined empirically.

The Table below summarizes the data of FIG. 13G:

| $FWHM_{RESET}$ (ns) | Recovery Time (ns) | Minimum $T_{OFF}$ (ns) |
|---|---|---|
| 23.3 | ~45 | ~45 |
| 13.3 | ~40 | ~40 |
| 6.7 | ~20 | ~20 |
| 3.4 | ~10 | ~10 |

As can be seen from the data in FIG. 13G, shorter reset pulse widths result in shorter recovery times for the threshold voltage of the memory cell. The suitable $T_{OFF}$ time intervals should be long enough to allow for recovery to be substantially complete. Thus, for a reset pulse width of 23.3 ns, as shown in FIG. 13G the threshold voltage stabilizes at about 45 ns after the reset pulse. Therefore, suitable $T_{OFF}$ for a pulse width of 23.3 ns is about 45 ns. For a shorter reset pulse width, the recovery time is much shorter as can be seen in the data of FIG. 13G. For the reset pulse width of 3.4 ns, the recovery time is about 10 ns.

In the measured data taken for FIG. 13G, it is observed that the recovery time saturates and thus stabilizes at about 45 ns as the pulse width is increased above about 25 ns. Thus, for pulse widths longer than about 25 ns, the unexpected result of the reduction in recovery time as a function of the pulse width is no longer observed.

In the Table above, the ratios between $T_{OFF}$ and the $FWHM_{RESET}$ were about 1.9, 3.0, 3.0, and 2.9. It is discovered therefore, that for very short time specifications less than 70 ns ($T_{OFF}$ less than 45 ns) for the time required for programming and then reading a memory cell, the pulse width of the reset pulse should be shorter than one half of the $T_{OFF}$ interval. For even shorter time specifications, such as $T_{OFF}$ less than 10 ns, the pulse width of the reset pulse should be shorter than one third of the $T_{OFF}$ interval. As a result, for a recovery time of 3 ns or less, the pulse width of the reset pulse should be about 2 ns or less.

Referring back to the timing diagrams of FIGS. 4 and 5 and using the data of FIG. 13G, the table summarizes the summation of equations (1) and (2) above for various embodiments of the high speed read after reset operation 400 and high speed read after set operation 500.

| $FWHM_{RESET}$ or $FWHM_{SET}$ (ns) | T (ns) | Sum (Equation 1) |
|---|---|---|
| 23.3 | 45 | 68.3 |
| 13.3 | 40 | 53.3 |
| 6.7 | 20 | 26.7 |
| 3.4 | 10 | 13.4 |

For a FWHM$_{RESET}$ or FWHM$_{SET}$ of 2 ns, the minimum T should be about 3 ns, resulting in a sum of 5 ns for equation (1) or equation (2).

Figure 14:
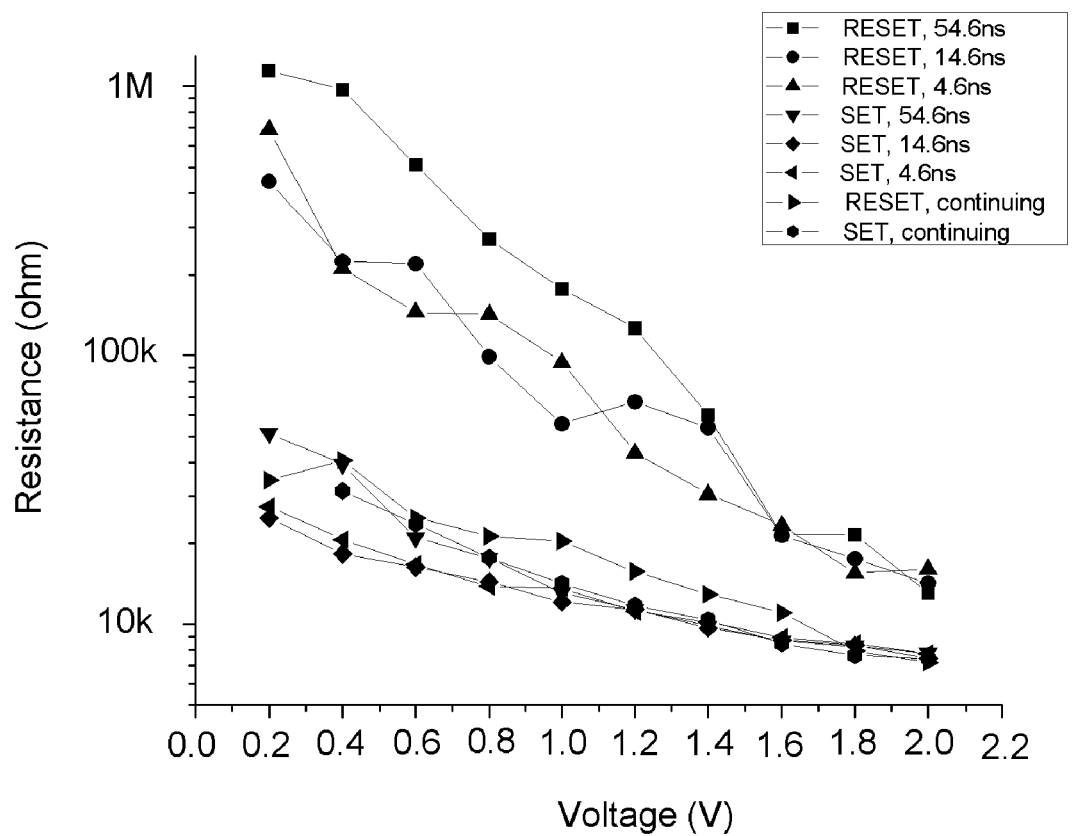
FIG. 14 is the measured resistance following reset and set pulses as a function of $T_{OFF}$.

Referring to FIGS. 4 and 5, the magnitude V$_{READ}$ of the read pulse 435 was varied, for representative T$_{OFF}$ of 0 ns (labeled "continuing" in FIG. 14), 4.6 ns, 14.6 ns, and 56.6 ns, to provide the measured resistance of FIG. 14. The reset pulse 415 used to obtain the data of FIG. 14 has a pulse height of 5.8 V, a rise time of 1.7 ns, a fall time of 1.8 ns, and a FWHM$_{RESET}$ pulse width of 4.6 ns. The set pulse 515 used to obtain the data of FIG. 14 has a pulse height of −4 V, a rise time of 1.7 ns, a fall time of 1.8 ns, and a FWHM$_{SET}$ pulse width of 4.6 ns. The pulse width of the set pulse was 20 ns, and the resistance was measured near the middle of the read pulses.

As shown in the data of FIG. 14, with zero T$_{OFF}$ the resistance following the set and reset pulses was essentially the same across the range of read voltages in the plot. With longer T$_{OFF}$ intervals, the differences between the set and reset resistances increases. As can be seen in the data, a T$_{OFF}$ of 4.6 ns is sufficient to read the resistance of the memory cell following set and reset pulse widths of 3.4 ns.

The operations described herein have been demonstrated to overcome the performance limitations of slow set operation and long recovery time commonly associated with phase change memory devices, enabling high speed operation of phase change memory devices.

It has been discovered that a shorter programming pulse width less than or equal to about 25 ns can decrease the recovery time of a phase change memory element to about 45 ns or less, and thus raise the resistance of the memory element within short time intervals, resulting in short delay time before reading a device following a set or reset operation.

Additionally, the set and reset pulses having opposite voltage polarity have been demonstrated to overcome the long set speed behavior of memory cell structures such as small bridge-type memory cells which suffer significant thermoelectric effects that cause asymmetrical heating in the body of the phase change material. Representative configurations suffering this effect have an active region with a heating zone during a set operation which is spaced away from electrodes contacting the phase change material. Bridge cells having a thickness of between abut 3 and 20 nm and pillar cells having a width or diameter less than 25 nm are typical structures to which the operations described herein can be applied to overcome the long set speed behavior.

Representative configurations suffering this behavior can also have a relatively long current path through the phase change material and a cross-sectional area that is small relative to the current path. Examples include bridge cells having a thickness less than 10 nm, and a length between electrodes which is defined by the width of the insulating member of greater than 10 nm. In particular, long set speed memory cells include phase change materials such as Ge$_x$Sb$_y$Te$_z$ and Ge$_x$Te$_y$ which transition to the set state in a nucleation dominated mode in which crystallization is initiated from numerous locations within the material.

Figure 15:
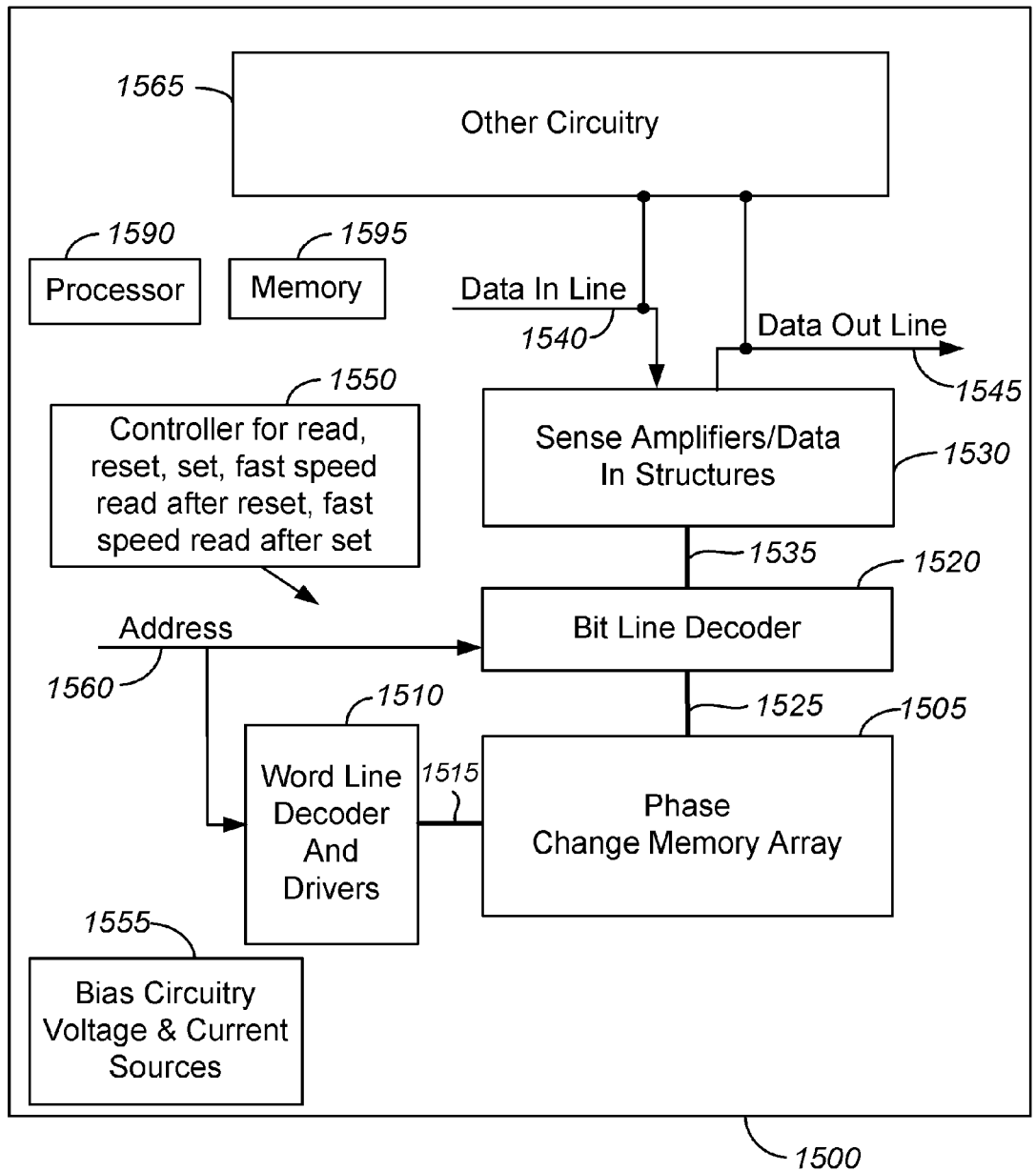
FIG. 15 is a simplified block diagram of an integrated circuit in which the operations described herein can be implemented.

FIG. 15 is a simplified block diagram of an integrated circuit 1500 in which the high speed operations described herein can be implemented. The integrated circuit 1500 includes a memory array 1505 of memory cells having phase change memory elements programmable to a plurality of resistance states including a lower resistance state and a higher resistance state. A word line decoder 1510 having read, reset, set, high speed read after reset, and high speed read after set modes is coupled to and in electrical communication with a plurality of word lines 1515 arranged along rows in the memory array 1505. A bit line (column) decoder 1520 is in electrical communication with a plurality of bit lines 1525 arranged along columns in the array 1505 for reading and programming the memory cells (not shown) in array 1505.

Addresses are supplied on bus 1560 to word line decoder and drivers 1510 and bit line decoder 1520. Sense circuitry (Sense amplifiers) and data-in structures in block 1530, including voltage and/or current sources for the read and program modes are coupled to bit line decoder 1520 via data bus 1535. Data is supplied via a data-in line 1540 from input/output ports on integrated circuit 1500, or from other data sources internal or external to integrated circuit 1500, to data-in structures in block 1530. Other circuitry 1565 may be included on integrated circuit 1500, such as a general purpose processor or special purpose application circuitry, or a combination of modules providing system-on-a-chip functionality supported by array 1505. Data is supplied via a data-out line 1545 from the sense amplifiers in block 1530 to input/output ports on integrated circuit 1500, or to other data destinations internal or external to integrated circuit 1500.

The integrated circuit 1500 includes a controller 1550 for read, reset, set, high speed read after reset, and high speed read after set modes of the memory cells of the array 1505. The controller 1550, implemented in this example using a bias arrangement state machine, controls the application of bias circuitry voltage & current sources 1555 for the application of bias arrangements including read, set and reset to the word lines 1515, bit lines 1525, and in some embodiments source lines. Controller 1550 may be implemented using special-purpose logic circuitry as known in the art. In alternative embodiments, controller 1550 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1550.

The integrated circuit 1500 includes one or more central processing units, which are arranged to execute instructions stored in program memory 1595 including instructions to control operations of the array 1505 for applying the pulses of the operations described herein to the phase change memory cells of the array 1505.

Figure 16:
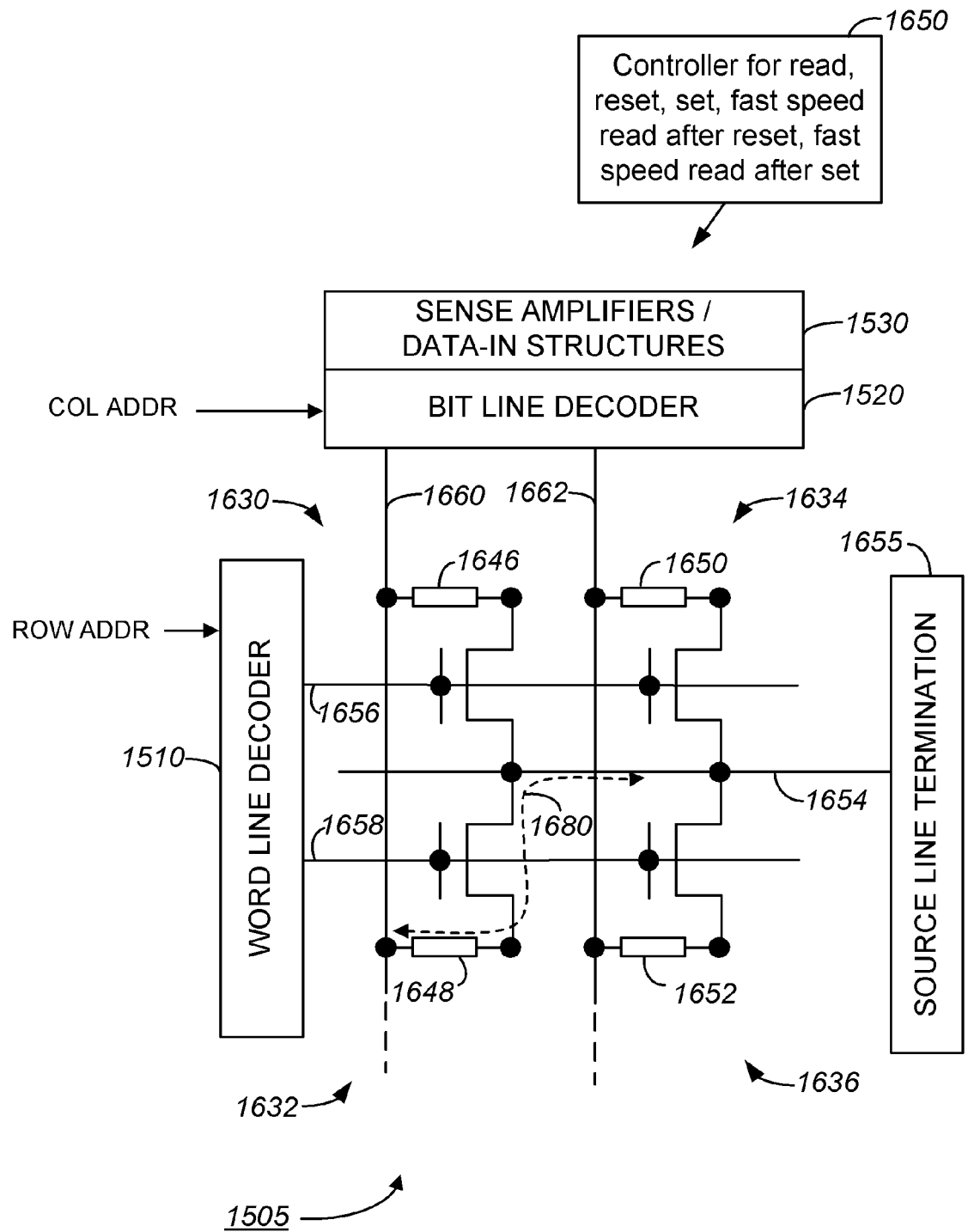
FIG. 16 is a schematic diagram of a portion of the memory array of the integrated circuit of FIG. 15.

As shown in FIG. 16, each of the memory cells of array 1505 includes an access transistor (or other access device such as a diode) and a phase change memory element. In FIG. 16 four memory cells 1630, 1632, 1634, 1636 having respective memory elements 1640, 1642, 1644, 1646 are illustrated, representing a small section of an array that can include millions of memory cells. The memory elements are programmable to a plurality of resistance states including a lower and a higher resistance state.

Sources of each of the access transistors of memory cells 1630, 1632, 1634, 1636 are connected in common to source line 1654 that terminates in source line termination circuit 1655, such as a ground terminal. In another embodiment the source lines of the access devices are not electrically connected, but independently controllable. The source line termination circuit 1655 may include bias circuitry such as voltage sources and current sources, and decoding circuits for applying bias arrangements, other than ground, to the source line 1654 in some embodiments.

A plurality of word lines including word lines 1656, 1658 extend in parallel along a first direction. Word lines 1656, 1658 are in electrical communication with word line decoder 1510. The gates of access transistors of memory cells 1630 and 1634 are connected to word line 1656, and the gates of access transistors of memory cells 1632 and 1636 are connected in common to word line 1658.

A plurality of bit lines including bit lines 1660, 1662 extend in parallel in a second direction and are in electrical communication with bit line decoder 1520. In the illustrated embodiment each of the memory elements are arranged between the drain of the corresponding access device and the corresponding bit line. Alternatively, the memory elements may be on the source side of the corresponding access device.

It will be understood that the memory array 1605 is not limited to the array configuration illustrated in FIG. 16, and additional array configurations can also be used. Additionally, instead of MOS transistors, bipolar transistors may be used as access devices in some embodiments.

In operation each of the memory cells in the array 1605 store data depending upon the resistance of the corresponding memory element. The data value may be determined, for example, by comparison of current on a bit line for a selected memory cell to that of a suitable reference current by sense amplifiers of sense circuitry 1530. The reference current can be established so that a predetermined range of currents correspond to a logical "0", and a differing range of currents correspond to a logical "1". In a memory cell having three or more states, reference currents can be established so that differing ranges of bit line currents correspond to each of the three or more states.

Reading, or writing to a memory cell of array 1605 can be achieved by applying a suitable voltage to one of word lines 1656, 1658 and coupling one of bit lines 1660, 1662 to a voltage so that current flows through the selected memory cell. For example, a current path 1680 through a selected memory cell (in this example memory cell 1832 and corresponding memory element 1648) is established by applying voltages to the bit line 1660, word line 1658, and source line 1654 sufficient to turn on the access transistor of memory cell 1632 and induce current in path 1680 to flow from the bit line 1660 to the source line 1654, or vice-versa. The level and duration of the voltages applied is dependent upon the operation performed.

In a read (or sense) operation of memory cell 1632, word line decoder 1510 facilitates providing word line 1658 with a suitable voltage to turn on the access transistor of the memory cell 1632. Bit line decoder 1520 facilitates supplying a voltage to bit line 1660 of suitable amplitude and duration to induce current to flow that does not result in the memory element 1648 undergoing a change in resistive state. The current on the bit line 1660 and through the memory element 1648 is dependent upon the resistance of, and therefore the data state associated with, the memory element 1648 of the memory cell 1632. Thus, the data state of the memory cell may be determined, for example by comparison of the current on bit line 1660 with a suitable reference current by sense amplifiers of sense circuitry 1530.

In a reset operation of a data value to be stored in the memory cell 1632, bias circuitry voltage and current sources 1555 coupled to the array 1505 applies a reset bias arrangement as described herein comprising one or more pulses to the bit line 1660 and/or word line 1658 and/or source line 1654 to induce current in path 1680. The resultant pulses of across the memory element 1648 change the resistance state of the memory element 1648 from the lower resistance state to the higher resistance state.

In a set operation of a data value to be stored in the memory cell 1632, bias circuitry voltage and current sources 1555 coupled to the array 1505 applies a set bias arrangement as described herein comprising one or more pulses to the bit line 1660 and/or word line 1658 and/or source line 1654 to induce current in path 1680. The resultant pulses across the memory element 1648 change the resistance state of the memory element 1648 from the higher resistance state to the lower resistance state.

Embodiments of the memory cells described herein include phase change based memory materials, including chalcogenide based materials and other materials, for the memory elements. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

An exemplary method for forming chalcogenide material uses chemical vapor deposition CVD such as that disclosed in US Publication No 2006/0172067 entitled "Chemical Vapor Deposition of Chalcogenide Materials", which is incorporated by reference herein.

A post-deposition annealing treatment in a vacuum or in an N2 ambient is optionally performed to improve the crystallized state of chalcogenide material. The annealing temperature typically ranges from 100° C. to 400° C. with an anneal time of less than 30 minutes.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for operating a memory cell comprising a phase change memory element programmable to a plurality of resistance states, the method comprising:
    applying a first pulse across the phase change memory element to change the resistance state from a first resistance state to a second resistance state, the first pulse having leading and trailing edges with full-width at half-maximum (FWHM) points defining a first pulse width; and
    applying a second pulse across the phase change memory element to determine the resistance state, the second pulse having leading and trailing edges with FWHM points defining a second pulse width, the FWHM point of the second pulse leading edge and the FWHM point of the first pulse trailing edge separated by a time interval, wherein a sum of the time interval and the first pulse width is less than or equal to 70 ns, and the first pulse width is less than the time interval.

2. The method of claim 1, wherein the first pulse width is less than or equal to 25 ns.

3. The method of claim 1, wherein:
    the first pulse width is less than or equal to 10 ns; and
    the sum is less than or equal to 30 ns.

4. The method of claim 1, wherein the first resistance state is higher than the second resistance state.

5. The method of claim 1, wherein the second resistance state is higher than the first resistance state.

6. The method of claim 1, further comprising:
    applying a third pulse across the phase change memory element to change the resistance state from the second resistance state to the first resistance state, the third pulse having leading and trailing edges with FWHM points defining a third pulse width; and
    applying a fourth pulse across the phase change memory to determine the resistance state, the fourth pulse having leading and trailing edges with FWHM points defining a fourth pulse width, the FWHM point of the fourth pulse leading edge and the FWHM point of the third pulse trailing edge separated by a second time interval, wherein a second sum of the second time interval and the third fourth pulse width is less than or equal to 70 ns, the third pulse having a voltage polarity across the phase change memory element opposite that of the first pulse.

7. The method of claim 6, wherein:
    the first and third pulse widths are each less than or equal to 10 ns; and
    the sum and the second sum are each less than or equal to 30 ns.

8. The method of claim 6, wherein the memory cell further comprises first and second electrodes, the phase change memory element electrically coupling the first electrode to the second electrode, and the phase change memory element having an active region spaced away from the first and second electrodes.

9. The method of claim 6, wherein the memory cell further comprises first and second electrodes and a dielectric spacer between the first electrode and the second electrode, the phase change memory element comprising a bridge of phase change material extending across the phase change memory element to contact the first and second electrodes, the phase change memory element defining an inter-electrode path between the first and second electrodes having an inter-electrode path length defined by a width of the dielectric spacer.

10. The method of claim 6, wherein the memory cell further comprises first and second electrodes, the phase change memory element comprising a pillar of phase change material surrounded by a dielectric and electrically coupling the first electrode to the second electrode, the pillar of phase change material having a width less than that of the first and second electrodes.

11. The method of claim 1, wherein applying the second pulse across the phase change memory element to determine the resistance state comprises:
    applying the second pulse to induce to induce a current to flow through the phase change memory element; and
    comparing the current to a reference to determine the resistance state.

12. A method for operating a memory cell comprising a phase change memory element programmable to a plurality of resistance states, the method comprising:
    applying a first pulse across the phase change memory element to change the resistance state from a first resistance state to a second resistance state, the first pulse having leading and trailing edges with full-width at half-maximum (FWHM) points defining a first pulse width; and applying a second pulse across the phase change memory element to determine the resistance state, the second pulse having leading and trailing edges with FWHM points defining a second pulse width, the FWHM point of the second pulse leading edge and the FWHM point of the first pulse trailing edge separated by a time interval, wherein a sum of the time interval and the first pulse width is less than or equal to 70 ns, and the first pulse width is less than the time interval, wherein:

the first pulse width is less than or equal to 5 ns; and
the sum is less than or equal to 15 ns.

13. The method of claim 12, further comprising:
applying a third pulse across the phase change memory element to change the resistance state from the second resistance state to the first resistance state, the third pulse having leading and trailing edges with FWHM points defining a third pulse width; and applying a fourth pulse across the phase change memory to determine the resistance state, the fourth pulse having leading and trailing edges with FWHM points defining a fourth pulse width, the FWHM point of the fourth pulse leading edge and the FWHM point of the third pulse trailing edge separated by a second time interval, wherein a second sum of the second time interval and the third fourth pulse width is less than or equal to 15 ns, the third pulse width is less than or equal to 5 ns, the third pulse having a voltage polarity across the phase change memory element opposite that of the first pulse.

14. An integrated circuit device comprising:
a memory cell comprising a phase change memory element programmable to a plurality of resistance states;
a controller including logic for:
applying a first pulse across the phase change memory element to change the resistance state from a first resistance state to a second resistance state, the first pulse having leading and trailing edges with full-width at half-maximum (FWHM) points defining a first pulse width; and
applying a second pulse across the phase change memory element to determine the resistance state, the second pulse having leading and trailing edges with FWHM points defining a second pulse width, the FWHM point of the second pulse leading edge and the FWHM point of the first pulse trailing edge separated by a time interval, wherein a sum of the time interval and the first pulse width is less than or equal to 70 ns, and the first pulse width is less than the time interval.

15. The device of claim 14, wherein the first pulse width is less than or equal to 25 ns.

16. The device of claim 14, wherein:
the first pulse width is less than or equal to 10 ns; and
the sum is less than or equal to 30 ns.

17. The device of claim 14, wherein the first resistance state is higher than the second resistance state.

18. The device of claim 14, wherein the second resistance state is higher than the first resistance state.

19. The device of claim 14, wherein the controller further includes logic for:
applying a third pulse across the phase change memory element to change the resistance state from the second resistance state to the first resistance state, the third pulse having leading and trailing edges with FWHM points defining a third pulse width; and applying a fourth pulse across the phase change memory to determine the resistance state, the fourth pulse having leading and trailing edges with FWHM points defining a fourth pulse width, the FWHM point of the fourth pulse leading edge and the FWHM point of the third pulse trailing edge separated by a second time interval, wherein a second sum of the second time interval and the third pulse width is less than or equal to 70 ns, the third pulse having a voltage polarity across the phase change memory element opposite that of the first pulse.

20. The device of claim 19, wherein:
the first and third pulse widths are each less than or equal to 10 ns; and
the sum and the second sum are each less than or equal to 30 ns.

21. The device of claim 19, wherein the memory cell further comprises first and second electrodes, the phase change memory element electrically coupling the first electrode to the second electrode, and the phase change memory element having an active region spaced away from the first and second electrodes.

22. The device of claim 19, wherein the memory cell further comprises first and second electrodes and a dielectric spacer between the first electrode and the second electrode, the phase change memory element comprising a bridge of phase change material extending across the phase change memory element to contact the first and second electrodes, the phase change memory element defining an inter-electrode path between the first and second electrodes having an inter-electrode path length defined by a width of the dielectric spacer.

23. The device of claim 19, wherein the memory cell further comprises first and second electrodes, the phase change memory element comprising a pillar of phase change material surrounded by a dielectric and electrically coupling the first electrode to the second electrode, the pillar of phase change material having a width less than that of the first and second electrodes.

24. The device of claim 14, wherein applying the second pulse across the phase change induces a current to flow through the phase change memory element, and further comprising sense circuitry to compare the current to a reference to determine the resistance state.

25. An integrated circuit device comprising:
a memory cell comprising a phase change memory element programmable to a plurality of resistance states;
a controller including logic for:
applying a first pulse across the phase change memory element to change the resistance state from a first resistance state to a second resistance state, the first pulse having leading and trailing edges with full-width at half-maximum (FWHM) points defining a first pulse width; and
applying a second pulse across the phase change memory element to determine the resistance state, the second pulse having leading and trailing edges with FWHM points defining a second pulse width, the FWHM point of the second pulse leading edge and the FWHM point of the first pulse trailing edge separated by a time interval, wherein a sum of the time interval and the first pulse width is less than or equal to 15 ns, and the first pulse width is less than the time interval and less than or equal to 5 ns.

26. The device of claim 25, wherein the controller further includes logic for:
applying a third pulse across the phase change memory element to change the resistance state from the second resistance state to the first resistance state, the third pulse having leading and trailing edges with FWHM points defining a third pulse width; and applying a fourth pulse across the phase change memory to determine the resistance state, the fourth pulse having leading and trailing edges with FWHM points defining a fourth pulse width, the FWHM point of the fourth pulse leading edge and the FWHM point of the third pulse trailing edge separated by a second time interval, wherein a second sum of the second time interval and the third pulse width is less than or equal to 15 ns, the third pulse width is less than or equal to 5 ns, the third pulse having a voltage polarity across the phase change memory element opposite that of the first pulse.

* * * * *